(12) United States Patent
Nakatsuka et al.

(10) Patent No.: US 7,286,001 B2
(45) Date of Patent: Oct. 23, 2007

(54) HIGH-FREQUENCY SWITCHING DEVICE AND SEMICONDUCTOR DEVICE

(75) Inventors: Tadayoshi Nakatsuka, Callisensvej (DK); Katsushi Tara, Kyoto (JP); Shinji Fukumoto, Mishima-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 56 days.

(21) Appl. No.: 11/402,849

(22) Filed: Apr. 13, 2006

(65) Prior Publication Data

US 2006/0181328 A1 Aug. 17, 2006

Related U.S. Application Data

(62) Division of application No. 10/864,352, filed on Jun. 10, 2004, now Pat. No. 7,199,635.

(30) Foreign Application Priority Data

Jun. 12, 2003 (JP) ............................. 2003-167615

(51) Int. Cl.
*H03L 5/00* (2006.01)
(52) U.S. Cl. ............... 327/308; 327/365; 333/81 R; 333/103; 333/104
(58) Field of Classification Search ............... None
See application file for complete search history.

(56) References Cited

U.S. PATENT DOCUMENTS 4,810,911 A  3/1989  Noguchi ............ 327/431
4,929,855 A  5/1990  Ezzeddine ............ 327/427
5,717,356 A  2/1998  Kohama ............ 327/427

(Continued)

FOREIGN PATENT DOCUMENTS

EP  0903855  3/1999

(Continued)

OTHER PUBLICATIONS

Japanese Office Action dated May 19, 2006 with English translation.

(Continued)

*Primary Examiner*—Kenneth B. Wells
*Assistant Examiner*—Hiep Nguyen
(74) *Attorney, Agent, or Firm*—Stevens, Davis, Miller & Mosher, LLP

(57) ABSTRACT

The first terminals of a plurality of resistor elements are connected to the intermediate connection points of a plurality of FETs connected in series, and a voltage, having a phase opposite to that of the voltage applied to the gate terminals of the plurality of FETs, is applied to the second terminals of the plurality of resistor elements. With this configuration, the potentials at the intermediate connection points of the plurality of FETs connected in series can be prevented from lowering. As a result, the power that can be handled can be increased. Furthermore, since the potentials at the intermediate connection points of the plurality of FETs connected in series can be prevented from lowering, the deterioration of the distortion characteristic and the isolation characteristic owing to the lowering of the potentials at the intermediate connection points of the plurality of field-effect transistors connected in series is prevented, and excellent high-frequency characteristics are obtained.

12 Claims, 15 Drawing Sheets

U.S. PATENT DOCUMENTS

| | | | |
|---|---|---|---|
| 5,731,607 A | 3/1998 | Kohama | 257/275 |
| 5,825,227 A * | 10/1998 | Kohama et al. | 327/308 |
| 5,903,178 A | 5/1999 | Miyatsuji et al. | 327/308 |
| 5,917,362 A | 6/1999 | Kohama | 327/408 |
| 5,969,560 A * | 10/1999 | Kohama et al. | 327/308 |
| 6,218,890 B1 | 4/2001 | Yamaguchi et al. | 327/427 |
| 6,489,856 B1 * | 12/2002 | Weigand | 333/81 R |
| 6,642,578 B1 | 11/2003 | Arnold et al. | 257/341 |
| 6,657,266 B2 * | 12/2003 | Hirai et al. | 257/393 |
| 6,803,680 B2 | 10/2004 | Brindle et al. | 307/115 |
| 6,804,502 B2 * | 10/2004 | Burgener et al. | 455/333 |
| 6,853,235 B2 | 2/2005 | Nakayama et al. | 327/379 |
| 6,978,122 B2 | 12/2005 | Kawakyu et al. | 455/80 |
| 7,012,285 B2 | 3/2006 | Nakatsuka et al. | 257/190 |
| 2001/0040479 A1 | 11/2001 | Zhang | 327/427 |
| 2003/0090313 A1* | 5/2003 | Burgener et al. | 327/408 |
| 2004/0207454 A1* | 10/2004 | Hidaka et al. | 327/427 |
| 2005/0014473 A1* | 1/2005 | Zhao et al. | 455/83 |
| 2005/0017789 A1 | 1/2005 | Burgener et al. | 327/436 |
| 2005/0047038 A1 | 3/2005 | Nakajima et al. | 361/58 |
| 2005/0179506 A1 | 8/2005 | Takahashi et al. | 333/104 |
| 2006/0001473 A1 | 1/2006 | Yasuda et al. | 327/415 |

FOREIGN PATENT DOCUMENTS

| | | |
|---|---|---|
| JP | 06085641 | 3/1994 |
| JP | 08204528 | 8/1996 |
| JP | 8228138 | 9/1996 |
| JP | 08293776 | 11/1996 |
| JP | 10126176 | 5/1998 |
| JP | 10215128 | 8/1998 |
| JP | 11150464 | 6/1999 |
| JP | 2000223902 | 8/2000 |
| JP | 2000277703 | 10/2000 |
| JP | 2002232278 | 8/2002 |
| JP | 200386767 | 3/2003 |

OTHER PUBLICATIONS

Japanese Office Action dated Mar. 1, 2006 with English translation.
European Search Report dated Mar. 16, 2006.

* cited by examiner

HIGH-FREQUENCY SWITCHING DEVICE AND SEMICONDUCTOR DEVICE

This is a divisional application of application Ser. No. 10/864,352 filed Jun. 10, 2004 now U.S. Pat. No. 7,199,635.

BACKGROUND OF THE INVENTION

1. Field of the Invention

The present invention relates to a high-frequency switching device for carrying out amplification, switching and the like of high-frequency signals in mobile communication apparatuses and the like, and to a semiconductor device obtained by integrating this high-frequency switching device on a semiconductor substrate.

2. Prior Art

In an SPDT (Single-Pole Double-Throw) switching device, one of prior arts of high-frequency switching devices, a resistor element is connected in parallel between the drain and source of each FET constituting a high-frequency switching circuit section as shown in FIG. 15 (for example, refer to Japanese Laid-open Patent Application 2002-232278 (page 13, FIG. 7). In FIG. 15, reference codes 130 to 137 respectively designate depletion-type FETs. Reference codes 250 to 257 respectively designate resistor elements having a resistance value R1. Reference codes 260 to 267 respectively designate resistor elements having a resistance value R2. Reference codes 270 and 271 respectively designate resistor elements having a resistance value R3. Reference codes 510 to 512 respectively designate high-frequency signal input/output terminals. Reference codes 610 and 611 respectively designate control terminals. Reference codes I1 and I2 respectively designate currents.

With this configuration, in the case when a voltage of 3 V is applied to the control terminal 610 and a voltage of 0 V is applied to the control terminal 611, for example, the FETs 130 to 133 are turned ON and the FETs 134 to 137 are turned OFF. Hence, the path from the high-frequency signal input/output terminal 510 to the high-frequency signal input/output terminal 511 can be set in the ON state, and the path from the high-frequency signal input/output terminal 510 to the high-frequency signal input/output terminal 512 can be set in the OFF state.

However, in the configuration of the above-mentioned prior art, with respect to the ON path, a gate forward current flows from the control terminal 610 to the control terminal 611 via the resistor elements 250 to 253, the FETs 130 to 133 and the resistor element 270. The resistor elements 250 to 253, 260 to 263 and 270 are required to be set at a resistance value of 50 kΩ or more so as not to affect the high-frequency characteristics.

When it is assumed that the built-in voltage (forward voltage) of the FET is 0.4 V, the DC potential VB at point B in the figure is represented as follows:

since 3 V−0.4 V=(R1/4+R3)×I1,

I1=2.6 V/(R1+4R3)

Furthermore, since VB=R3×4I1,

VB is represented by $$VB=10.4 \times R3/(R1+4R3) \quad (1)$$

For example, in the case when the values of the above-mentioned resistor elements 250 to 253, 260 to 263 and 270 are all 50 kΩ, and when it is assumed that the potential at the control terminal 610 is 3 V and that the potential at the control terminal 611 is 0 V, the DC potential at point B is about 2.1 V. Since the ON resistance values of the FETs 130 to 133 are respectively about several Ω and thus negligibly small, the potentials at points B, A and C are nearly equal. As a result, the reverse bias voltage of the FET 134 in the OFF path is about 2.1 V, nearly equal to the voltage at point B. The current 4I1 flowing in the resistor element 270 having the resistance value R3 is 40 μA.

The maximum power Pmax that can be handled by a switch circuit comprising n FETs connected in series is represented by $$P\max=2\{n(VH-VL+VT)\}^2/Z_0 \quad (2)$$

wherein VH designates a high-level voltage applied to the FET, VL designates a Low-level voltage applied to the FET, and VT designates the threshold voltage of the FET. $Z_0$ designates the characteristic impedance of the circuit, generally 50 Ω, and it is assumed that its value is also 50 Ω in this case. When VH=2.1 V and VL=0 V are substituted according to the above-mentioned results, and when the maximum power Pmax is calculated in the case when VT=−0.6 V, the maximum power Pmax is 1.40 W. Hence, the effect of the addition of the resistor elements 260 to 263 and the resistor elements 264 to 267 is hardly obtained.

In order that the DC potential VB at point B is raised and the current consumption is reduced at the same time, a method of increasing the resistance value R3 is thought to be used. However, in the case when the resistance value R3 is increased, there is a problem of resulting in the lowering of the potential VD at point D.

In other words, with respect to the OFF path, a gate reverse current flows from the control terminal 610 via the resistor element 271, the FETs 134 to 137 and the resistor elements 254 to 257. The potential VD at point D in the figure is represented by $$VD=3.0-(4 \times R3+6 \times R2)I2 \quad (3)$$

Since this path is also used as an ON path in some cases, the resistance values of the resistor elements 254 to 257 and 271 are required to be determined so that the conditions are the same as those of the above-mentioned ON path. In order that the potential VB is 2.4 V or more, for example, according to Equation (1), the resistance value R3 is required to be set at 300 kΩ. However, in this case, the potential VD at point D is 1.5 V on the premise that a current of about 1 μA usually flows as the gate reverse current (I2), whereby the maximum power Pmax is lowered further.

As described above, in the prior art, the handling power is apt to be lowered owing to the lowering of the drain-source potential of the FET, and the resistance value R3 cannot be decreased, whereby there is a problem of resulting in the increase of current consumption.

In order to avoid these problems, Japanese Laid-open Patent Application 2002-232278 has proposed a method wherein a capacitor is inserted between the high-frequency signal input/output terminal and the switch circuit section so that they are separated with respect to DC. However, if a capacitor formed in a semiconductor process is directly connected to the high-frequency signal input/output terminal, there are problems of significantly degrading ESD withstand voltage (electrostatic discharge withstand voltage) and increasing the area of, a semiconductor chip incorporating the capacitor.

SUMMARY OF THE INVENTION

An object of the present invention is to provide a high-frequency switching device and a semiconductor device capable of handling power larger than that of the prior art.

Another object of the present invention is to provide a high-frequency switching device and a semiconductor device also capable of reducing current consumption.

The present invention is intended to solve the problems encountered in the above-mentioned prior art. In a series circuit of a plurality of field-effect transistors, one ends of resistor elements are respectively connected individually to the connection points (source/drain) of the field-effect transistors, and a predetermined voltage is applied to the other ends of the resistor elements. With this configuration, the device can handle power larger than that of the prior art. Furthermore, the current consumption can be reduced.

A high-frequency switching device in accordance with a first invention comprises a plurality of high-frequency signal input/output terminals through which high-frequency signals are input/output, and a plurality of high-frequency switch circuit sections disposed between the plurality of high-frequency signal input/output terminals. Each of the plurality of high-frequency switch circuit sections comprises a series connection circuit of a plurality of field-effect transistors. Either a high-level voltage or a low-level voltage is applied to the gate terminals of the plurality of field-effect transistors, whereby ON and OFF states are attained. The above-mentioned configuration is common to third, fifth and seventh inventions described later.

In each of the plurality of high-frequency switch circuit sections, the first terminals of resistor elements are connected to the intermediate connection points of the plurality of field-effect transistors, and a voltage, having a phase opposite to that of the voltage applied to the gate terminals of the plurality of field-effect transistors to which the first terminals of the resistor elements are connected, is applied to the second terminals of the resistor elements.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art.

A high-frequency switching device in accordance with a second invention comprises a plurality of high-frequency signal input/output terminals through which high-frequency signals are input/output, a plurality of series high-frequency switch circuit sections disposed between the plurality of high-frequency signal input/output terminals, and a plurality of shunt high-frequency switch circuit sections disposed between the plurality of high-frequency signal input/output terminals and ground terminals. Each of the plurality of series high-frequency switch circuit sections and each of the plurality of shunt high-frequency switch circuit sections respectively comprise a series connection circuit of a plurality of field-effect transistors. Either a high-level voltage or a low-level voltage is applied to the gate terminals of the plurality of field-effect transistors, whereby ON and OFF states are attained. The above-mentioned configuration is common to fourth, sixth and eighth inventions described later.

In each of the plurality of series high-frequency switch circuit sections and each of the plurality of shunt high-frequency switch circuit sections, the first terminals of resistor elements are connected to the intermediate connection points of the plurality of field-effect transistors, and a voltage, having a phase opposite to that of the voltage applied to the gate terminals of the plurality of field-effect transistors to which the first terminals of the resistor elements are connected, is applied to the second terminals of the resistor elements.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art. Furthermore, since the potentials at the intermediate connection points of the plurality of field-effect transistors can be prevented from lowering, the deterioration of the distortion characteristic and the isolation characteristic owing to the lowering of the potentials at the intermediate connection points of the plurality of field-effect transistors is prevented, and excellent high-frequency characteristics are obtained.

A high-frequency switching device in accordance with a third invention has a basic configuration similar to that of the high-frequency switching device in accordance with the first invention. Furthermore, the third invention differs from the first invention in that the first terminals of resistor elements are connected to the intermediate connection points of the plurality of field-effect transistors, the cathodes of diodes are connected to the second terminals of the resistor elements, and a voltage, having a phase opposite to that of the voltage applied to the gate terminals of the plurality of field-effect transistors to which the first terminals of the resistor elements are connected, is applied to the anodes of the diodes.

With this configuration, an effect similar to that set forth in claim 1 is obtained. In addition, since the diodes are provided, when the field-effect transistors to which the cathodes of the diodes are connected via the resistor elements are ON, the forward currents of the field-effect transistors can be restricted, whereby current consumption can be reduced.

A high-frequency switching device in accordance with a fourth invention has a basic configuration similar to that of the high-frequency switching device in accordance with the second invention. Furthermore, the fourth invention differs from the second invention in that the first terminals of resistor elements are connected to the intermediate connection points of the plurality of field-effect transistors, the cathodes of diodes are connected to the second terminals of the resistor elements, and a voltage, having a phase opposite to that of the voltage applied to the gate terminals of the plurality of field-effect transistors to which the first terminals of the resistor elements are connected, is applied to the anodes of the diodes.

With this configuration, an effect similar to that set forth in claim 1 is obtained. In addition, since the diodes are provided, when the field-effect transistors to which the cathodes of the diodes are connected via the resistor elements are ON, the forward currents of the field-effect transistors can be restricted, whereby current consumption can be reduced.

A high-frequency switching device in accordance with a fifth invention has a basic configuration similar to that of the high-frequency switching device in accordance with the first invention. Furthermore, in the plurality of high-frequency switch circuit sections, that is, first and second high-frequency switch circuit sections operating reversely with each other, the fifth invention differs from the first invention in that the first terminals of first resistor elements are connected to the intermediate connection points of the first plurality of field-effect transistors constituting the first high-frequency switch circuit section, that the first terminals of second resistor elements are connected to the intermediate connection points of the second plurality of field-effect transistors constituting the second high-frequency switch circuit section, and that the second terminals of the first resistor elements connected to the first high-frequency switch circuit section are connected to the second terminals of the second resistor elements connected to the second high-frequency switch circuit section.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art.

Furthermore, since currents always flow from the field-effect transistors being in the ON state to the field-effect transistors being in the OFF state, a stable bias potential is ensured. As a result, the power that can be handled can be increased, and excellent high-frequency characteristics can be obtained.

A high-frequency switching device in accordance with a sixth invention has a basic configuration similar to that of the high-frequency switching device in accordance with the second invention. Furthermore, in each of the plurality of series high-frequency switch circuit sections and each of the plurality of shunt high-frequency switch circuit sections, that is, first and second high-frequency switch circuit sections operating reversely with each other, the sixth invention differs from the second invention in that the first terminals of first resistor elements are connected to the intermediate connection points of the first plurality of field-effect transistors constituting the first high-frequency switch circuit section, that the first terminals of second resistor elements are connected to the intermediate connection points of the second plurality of field-effect transistors constituting the second high-frequency switch circuit section, and that the second terminals of the first resistor elements connected to the first high-frequency switch circuit section are connected to the second terminals of the second resistor elements connected to the second high-frequency switch circuit section.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art. Furthermore, since the potentials at the intermediate connection points of the plurality of field-effect transistors can be prevented from lowering, the deterioration of the distortion characteristic and the isolation characteristic owing to the lowering of the potentials at the intermediate connection points of the plurality of field-effect transistors is prevented, and excellent high-frequency characteristics are obtained.

Furthermore, since currents always flow from the field-effect transistors being in the ON state to the field-effect transistors being in the OFF state, a stable bias potential is ensured. As a result, the power that can be handled can be increased, and excellent high-frequency characteristics can be obtained.

A high-frequency switching device in accordance with a seventh invention has a basic configuration similar to that of the high-frequency switching device in accordance with the first invention. Furthermore, the seventh invention differs from the first invention in that the first terminals of resistor elements are connected to the intermediate connection points of the plurality of field-effect transistors respectively constituting the plurality of high-frequency switch circuit sections, and that the second terminals of the resistor elements are all connected commonly.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art.

Furthermore, since the currents from the field-effect transistors being in the ON state to the field-effect transistors being in the OFF state are averaged, a stable bias voltage can be applied even when the circuit is complicated and when FETs always operating reversely do not exist.

A high-frequency switching device in accordance with an eighth invention has a basic configuration similar to that of the high-frequency switching device in accordance with the second invention. Furthermore, the eighth invention differs from the second invention in that the first terminals of resistor elements are connected to the intermediate connection points of the plurality of field-effect transistors respectively constituting the series high-frequency switch circuit sections and the shunt high-frequency switch circuit sections, and that the second terminals of the resistor elements are all connected commonly.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art. Furthermore, since the potentials at the intermediate connection points of the plurality of field-effect transistors can be prevented from lowering, the deterioration of the distortion characteristic and the isolation characteristic owing to the lowering of the potentials at the intermediate connection points of the plurality of field-effect transistors is prevented, and excellent high-frequency characteristics are obtained.

Furthermore, since the currents from the field-effect transistors being in the ON state to the field-effect transistors being in the OFF state are averaged, a stable bias voltage can be applied even when the circuit is complicated and when FETs always operating reversely do not exist.

A high-frequency switching device in accordance with a ninth invention has a plurality of high-frequency signal input/output terminals through which high-frequency signals are input/output, first and second control terminals to which voltages, having phases opposite to each other, are applied, and a plurality of high-frequency switch circuit sections disposed between the plurality of high-frequency signal input/output terminals.

Each of the plurality of high-frequency switch circuit sections comprises a series connection circuit of a plurality of field-effect transistors. Either a high-level voltage or a low-level voltage is applied to the gate terminals of the plurality of field-effect transistors through either the first or second control terminal, whereby ON and OFF-states are attained. The above-mentioned configuration is common to an 11th invention described later.

Furthermore, in each of the plurality of high-frequency switch circuit sections, the first terminals of first resistor elements are connected to the intermediate connection points of the plurality of field-effect transistors respectively constituting the plurality of switch circuit sections, the second terminals of the first resistor elements are connected commonly, the anode of a first diode is connected to the first control terminal, the anode of a second diode is connected to the second control terminal, the first terminal of a second resistor element, is connected to the cathodes of the first and second diodes, the second terminal of the second resistor element is grounded, and the connection point of the first and second diodes and the first terminal of the second resistor element is connected to the second terminals of the first resistor elements.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art.

In addition, a constant bias voltage can be applied at all times to the field-effect transistors by using the voltage OR circuit comprising the diodes.

A high-frequency switching device in accordance with a 10th invention has a plurality of-high-frequency signal input/output terminals through which high-frequency signals are input/output, first and second control terminals to which voltages, having phases opposite to each other, are applied, a plurality of series high-frequency switch circuit sections disposed between the plurality of high-frequency signal input/output terminals, and a plurality of shunt high-frequency switch circuit sections disposed between the plurality of high-frequency signal input/output terminals and ground terminals. Each of the plurality of series high-frequency switch circuit sections and each of the plurality of shunt high-frequency switch circuit sections respectively comprise a series connection circuit of a plurality of field-effect transistors. Either a high-level voltage or a low-level voltage is applied to the gate terminals of the plurality of field-effect transistors through either the first or second control terminal, whereby ON and OFF states are attained. The above-mentioned configuration is common to a 12th invention described later.

Furthermore, in each of the plurality of series high-frequency switch circuit sections and each of the plurality of shunt high-frequency switch circuit sections, the first terminals of first resistor elements are connected to the intermediate connection points of the plurality of field-effect transistors respectively constituting each of the plurality of series high-frequency switch circuit sections and each of the plurality of shunt high-frequency switch circuit sections, the second terminals of the first resistor elements are connected commonly, the anode of a first diode is connected to the first control terminal, the anode of a second diode is connected to the second control terminal, the first terminal of a second resistor element is connected to the cathodes of the first and second diodes, the second terminal of the second resistor element is grounded, and the connection point of the first and second diodes and the first terminal of the second resistor element is connected to the second terminals of the first resistor elements.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art. Furthermore, since the potentials at the intermediate connection points of the plurality of field-effect transistors can be prevented from lowering, the deterioration of the distortion characteristic and the isolation characteristic owing to the lowering of the potentials at the intermediate connection points of the plu-rality of field-effect transistors is prevented, and excellent high-frequency characteristics are obtained.

In addition, a constant bias voltage can be applied at all times to the field-effect transistors by using the voltage OR circuit comprising the diodes.

A high-frequency switching device in accordance with an 11th invention has a basic configuration similar to that of the high-frequency switching device in accordance with the ninth invention. Furthermore, the 11th invention differs from the ninth invention in that the first terminals of first resistor elements are connected to the intermediate connection points of the plurality of field-effect transistors respectively constituting the plurality of high-frequency switch circuit sections, that the anode of a first diode is connected to the first control terminal, that the first terminal of a second resistor element is connected to the cathode of the first diode, that the second terminal of the second resistor element is connected to the second control terminal, that the anode of a second diode is connected to the second control terminal, that the first terminal of a third resistor element is connected to the cathode of the second diode, that the second terminal of the third resistor element is connected to the first control terminal, that the cathode of the first diode is connected to the second terminals of the first resistor elements connected to the plurality of field-effect transistors, the gates of which are connected to the first control terminal, and that the cathode of the second diode is connected to the second terminals of the first resistor elements connected to the plurality of field-effect transistors, the gates of which are connected to the second control terminal.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art.

Furthermore, by using the combinations of the diodes and the resistor elements, a low bias voltage can be applied to the field-effect transistors being in the ON stage, and a high bias voltage can be applied to the field-effect transistors being in the OFF stage.

A high-frequency switching device in accordance with a 12th invention has a basic configuration similar to that of the high-frequency switching-device in accordance with the 10th invention. Furthermore, the 12th invention differs from the 10th invention in that the first terminals of first resistor elements are connected to the intermediate connection points of the plurality: of field-effect transistors respectively constituting each of the plurality of series high-frequency switch circuit sections and each of the plurality of shunt high-frequency switch circuit sections, that the anode of a first diode is connected to the first control terminal, that the first terminal of a second resistor element is connected to the cathode of the first diode, that the second terminal of the second resistor element is connected to the second control terminal, that the anode of a second diode is connected to the second control terminal, that the first terminal of a third resistor element is connected to the cathode of the second diode, that the second terminal of the third resistor element is connected to the first control terminal, that the cathode of the first diode is connected to the second terminals of the first resistor elements connected to the plurality of field-effect transistors, the gates of which are connected to the first control terminal, and that the cathode of the second diode is connected to the second terminals of the first resistor elements connected to the plurality of field-effect transistors, the gates of which are connected to the second control terminal.

With this configuration, the potentials at the intermediate connection points of the plurality of field-effect transistors can be prevented from lowering. As a result, the power that can be handled can be increased in comparison with that of the prior art, and the current consumption can be reduced in comparison with that of the prior art. Furthermore, since the potentials at the intermediate connection points of the plurality of field-effect transistors can be prevented from lowering, the deterioration of the distortion characteristic and the isolation characteristic owing to the lowering of the potentials at the intermediate connection points of the plurality of field-effect transistors is prevented, and excellent high-frequency characteristics are obtained.

Furthermore, by using the combinations of the diodes and the resistor elements, a low bias voltage can be applied to the field-effect transistors being in the ON stage, and a high bias voltage can be applied to the field-effect transistors being in the OFF stage.

In the high-frequency switching devices in accordance with the above-mentioned first to eighth inventions, it is preferable that a voltage inversion circuit and first and second control terminals to which the input/output signals of the voltage inversion circuit are applied are provided, and that either a high-level voltage or a low-level voltage is applied to the gate terminals of the plurality of field-effect transistors from either the first or second control terminal.

With this configuration, although the output voltage of the voltage inversion circuit becomes lower than the power supply voltage owing to a load resistor when a single control voltage is inverted by the voltage inversion circuit and used, the influence of the voltage lowering is prevented, whereby the lowering of the power that can be handled and the deterioration of the high-frequency characteristics, such as the distortion characteristic and isolation characteristic, can be minimized.

Furthermore, in the high-frequency switching devices in accordance with the above-mentioned ninth to 12th inventions, it is preferable that a voltage inversion circuit is provided and that the input/output signals of the voltage inversion circuit are applied to the first and second control terminals, respectively.

With this configuration, although the output voltage of the voltage inversion circuit becomes lower than the power supply voltage owing to a load resistor when a single control voltage is inverted by the voltage inversion circuit and used, the influence of the voltage lowering is prevented, whereby the lowering of the power that can be handled and the deterioration of the high-frequency characteristics, such as the distortion characteristic and isolation characteristic, can be minimized.

A semiconductor device in accordance with the present invention is obtained by integrating the high-frequency switching device in accordance with one of the first to 12th inventions on a semiconductor substrate.

This configuration has an action and an effect similar to those of the first to 12th inventions.

As described above, with the present invention, since the potentials at the intermediate connection points of the plurality of field-effect transistors can be prevented from lowering, the power that can be handled can be increased in comparison with that of the prior art. Furthermore, the deterioration of the distortion characteristic and the isolation characteristic owing to the lowering of the potentials at the intermediate connection points of the plurality of field-effect transistors is prevented, and excellent high-frequency characteristics are obtained.

PREFERRED EMBODIMENTS

Embodiment 1

Figure 1:
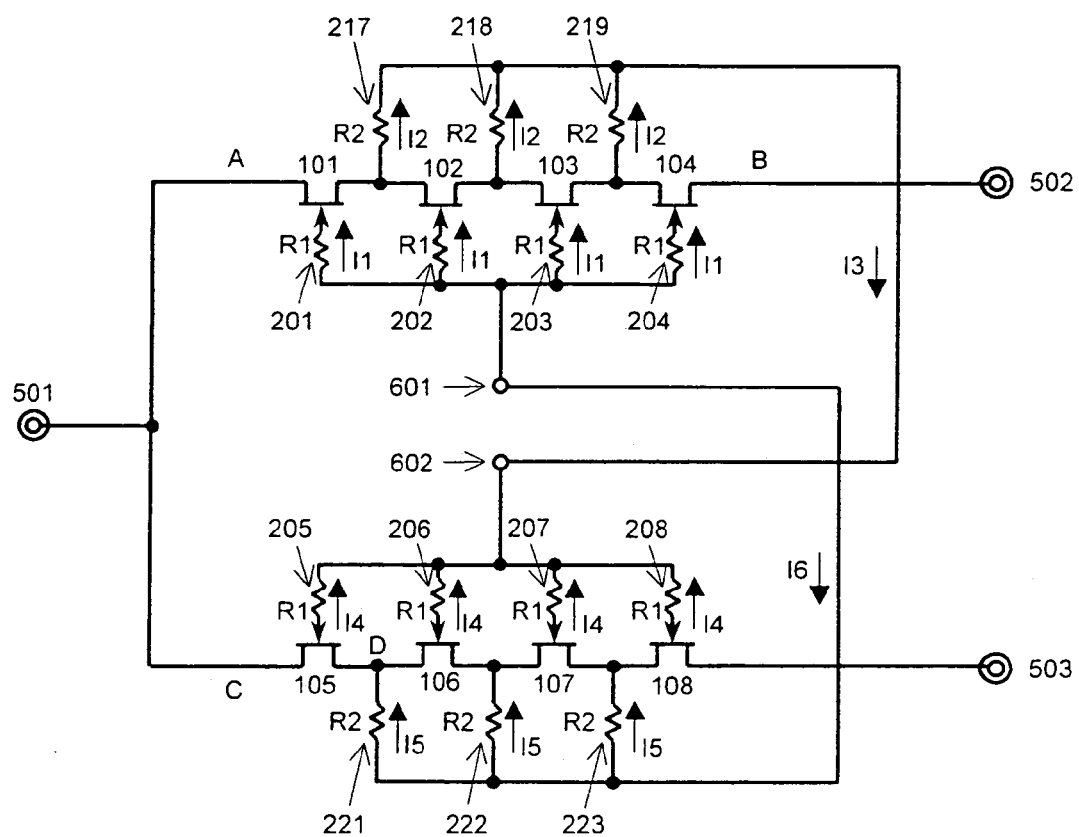
FIG. 1 is a circuit diagram showing an equivalent circuit of an SPDT switching device in accordance with Embodiment 1 of the present invention.

FIG. 1 is a circuit diagram showing the configuration of an SPDT switching device serving as Embodiment 1 of a high-frequency switching device in accordance with the present invention. In FIG. 1, reference codes 101 to 108 respectively designate depletion-type FETs. Reference codes 201 to 208 respectively designate resistor elements having a resistance value R1. Reference codes 217 to 219 and 221 to 223 respectively designate resistor elements having a-resistance value R2. Reference code 501 designates a first high-frequency signal input/output terminal.

Reference code 502 designates a second high-frequency signal input/output terminal. Reference code 503 designates a third high-frequency signal input/output terminal. Reference code 601 designates a first control terminal. Reference code 602 designates a second control terminal. Reference codes I1 to I6 respectively designate currents.

The operation of the SPDT switching device configured as shown in the above-mentioned FIG. 1 will be described below.

In the case when a signal input from the first high-frequency signal input/output terminal 501 is output to the second high-frequency signal input/output terminal 502, a high-level voltage is applied to the control terminal 601, and a low-level voltage is applied to the control terminal 602.

In FIG. 1, depletion-type FETs having a threshold value of about −0.6 V are used as the FETs 101 to 108. Therefore, in the above-mentioned voltage conditions, the FETs 101 to 104 to which the high-level voltage is applied are turned ON, and the FETs 105 to 108 to which the low-level voltage is applied are turned OFF.

The potential VB at point B and the potential VD at point D in the figure are respectively represented by $$VB = 10.4 \times R2/(3 \times R1 + 4 \times R2) \quad (4)$$

$$VD = 3.0 - R2 \times I5 \quad (5)$$

$$I3 = 3 \times VB/R2$$

$$I5 = I4 \times 4/3$$

When the high-level voltage is 3.0 V, when the low-level voltage is 0 V, when the gate forward voltage of the FETs is 0.4 V, when the reverse leak current I4 of the FETs is 1 µA, when the resistance value R1 is 50 kΩ, and when the resistance value R2 is 450 kΩ, VB=VA=VC=VD=2.4V is obtained.

However, code VA designates the potential at point A, and code VC designates the potential at point C. On the other hand, with respect to the current consumption, the current I3 is 16 µA in the above-mentioned conditions. Hence, current consumption can be reduced significantly in comparison with 40 µA of the prior art.

When it is assumed that the threshold value of the FETs is −0.6 V just as in the case of the prior art, the maximum power Pmax at this time is 2.07 W according to Equation (2). Hence, this embodiment can handle up to about 1.5 times the power of the prior art.

With this embodiment, the first terminals of the resistor elements 217 to 219 and 221 to 223 are connected to the intermediate connection points (source/drain) of the FETs 101 and 108. A voltage, having a phase opposite to that of the voltage applied to the gate terminals of the FETs 101 and 108 to which the first terminals of the resistor elements 217 to 219 and 221 to 223 are connected, is applied to the second terminals of the resistor elements 217 to 219 and 221 to 223, whereby the potentials at the intermediate connection points of the FETs 101 to 108 can be prevented from lowering. As a result, the power that can be handled can be increased in comparison with that of the prior art.

Embodiment 2

Figure 2:
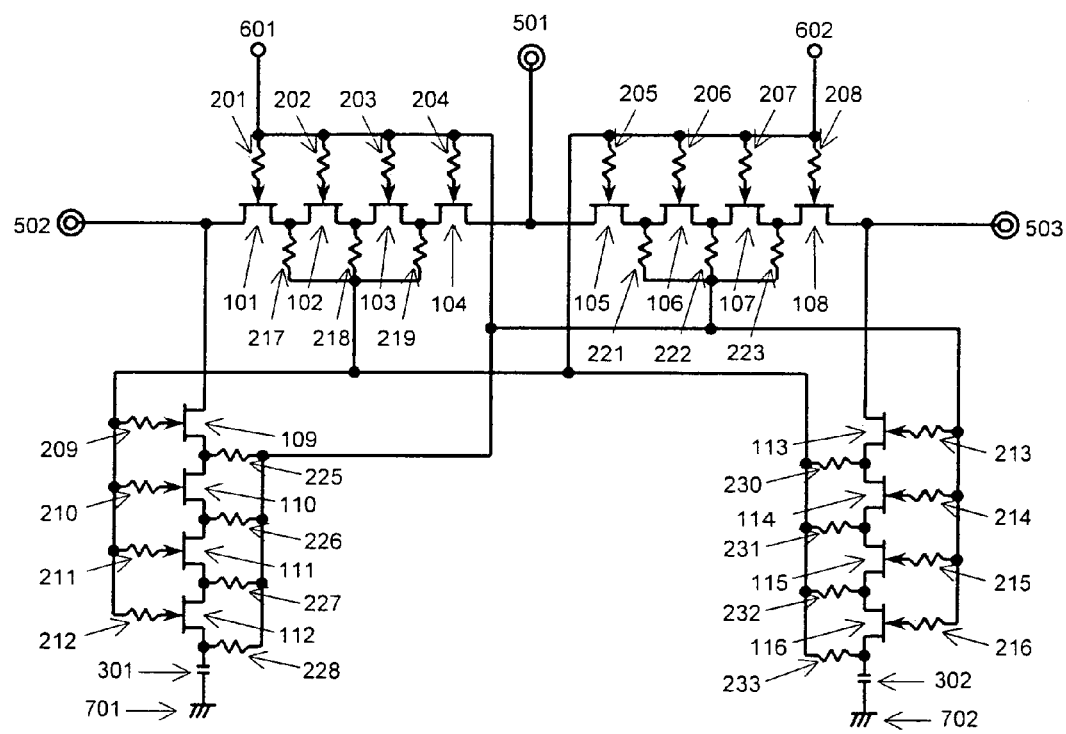
FIG. 2 is a circuit diagram showing an equivalent circuit of an SPDT switching device in accordance with Embodiment 2 of the present invention.
Figure 3:
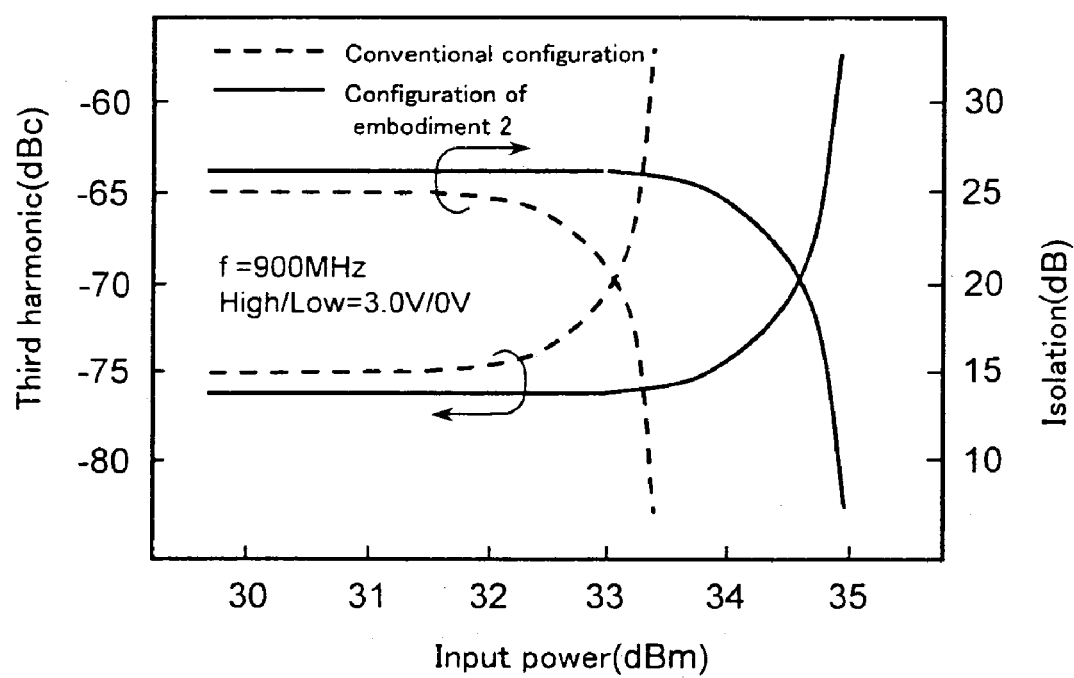
FIG. 3 is a characteristic diagram showing the high-frequency characteristics of the SPDT switching device in accordance with Embodiment 2 of the present invention.

FIG. 2 is a circuit diagram showing the configuration of an SPDT switching device serving as Embodiment 2 of a high-frequency switching device in accordance with the present invention. FIG. 3 is a characteristic diagram showing the high-frequency characteristics of the SPDT switching device shown in FIG. 2. In FIG. 2, reference codes 101 to 116 respectively designate depletion-type FETs. Reference codes 201 to 219, 221 to 223, 225 to 228 and 230 to 233 respectively designate resistor elements. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes 301 and 302 respectively designate capacitors. Reference codes 701 and 702 respectively designate ground terminals.

The operation of the SPDT switching device configured as shown in the above-mentioned FIG. 2 will be described below.

In order that the path from the first high-frequency signal input/output terminal 501 to the second high-frequency signal input/output terminal 502 is turned ON and that the path from the first high-frequency signal input/output terminal 501 to the third high-frequency signal input/output terminal 503 is turned OFF, a voltage of 3 V is applied to the control terminal 601, and a voltage of 0 V is applied to the control terminal 602.

Hence, the FETs 101 to 104 and the FETs 113 to 116 are turned ON, and the FETs 105 to 108 and the FETs 109 to 112 are turned OFF.

As a result, a high-frequency signal leaking from the high-frequency signal input/output terminal 501 to the high-frequency signal input/output terminal 503 is released to the ground terminal 702 via the FETs 113 to 116, whereby excellent isolation is ensured between the high-frequency signal input/output terminals 501 and 503.

In addition, it is required that the FETs 105 to 112 of the SPDT switching device are not turned ON even when a high power signal is input. The FETs can withstand an input power of up to 2.0 W by setting the resistance values at the same values as those of Embodiment 1 of the present invention.

Figure 6:
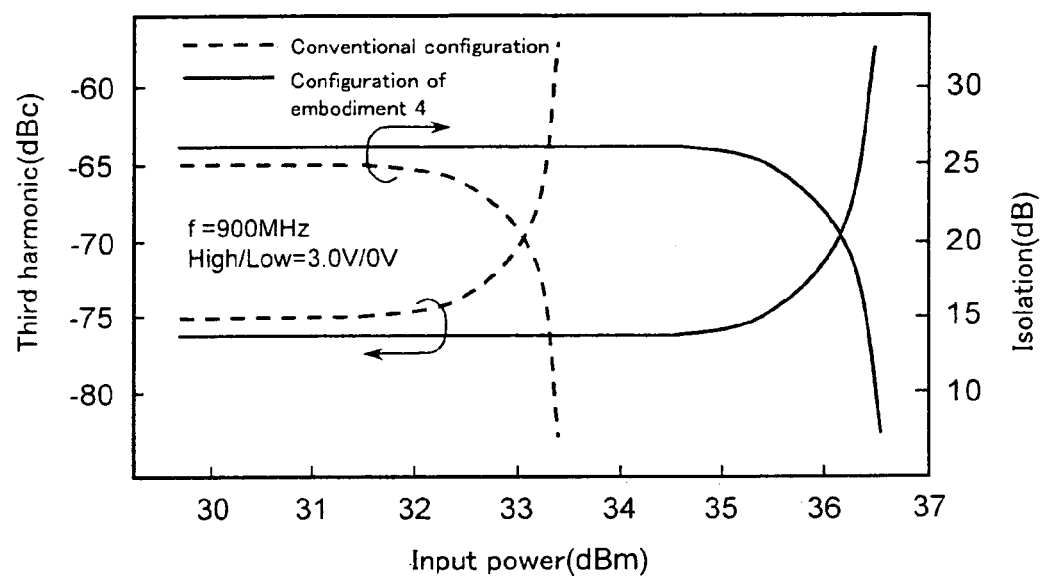
FIG. 6 is a characteristic diagram showing the high-frequency characteristics of the SPDT switching device in accordance with Embodiment 4 of the present invention.
Figure 11:
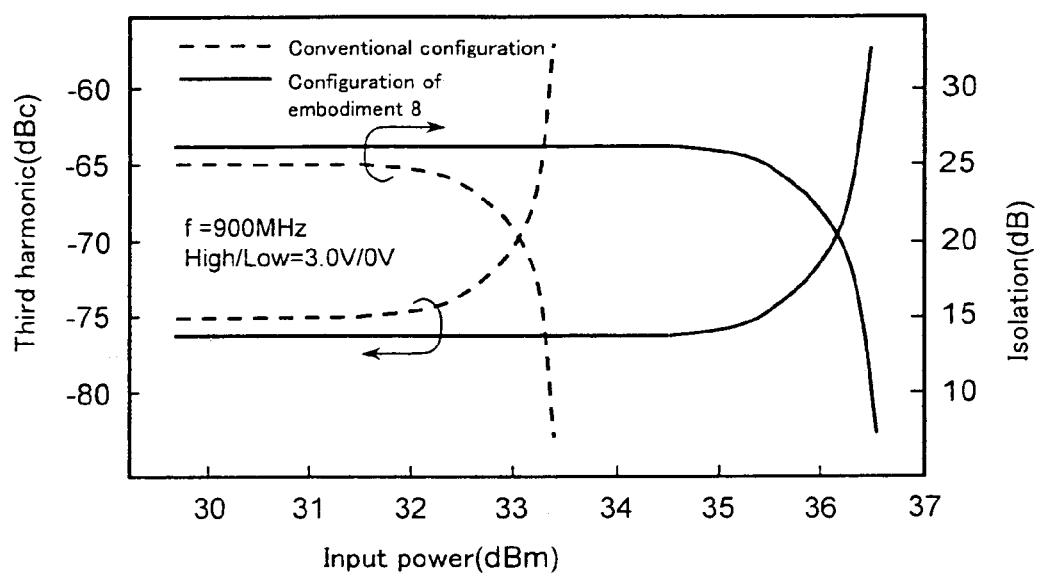
FIG. 11 is a characteristic diagram showing the high-frequency characteristics of the SPDT switching device in accordance with Embodiment 8 of the present invention.
Figure 14:
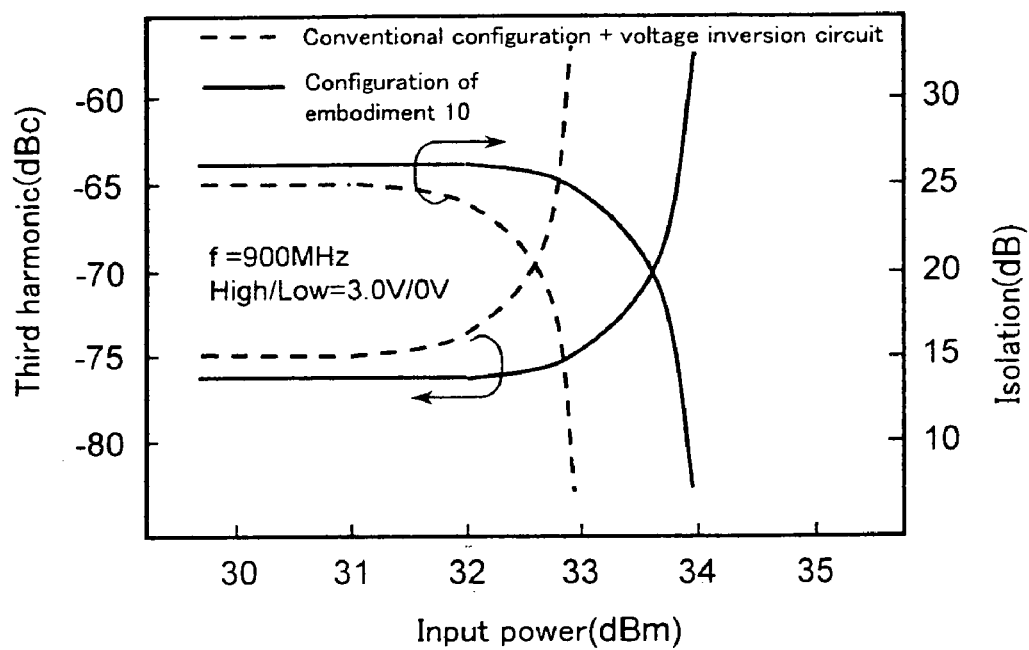
FIG. 14 is a characteristic diagram showing the high-frequency characteristics of the SPDT switching device in accordance with Embodiment 10 of the present invention.
Figure 15:
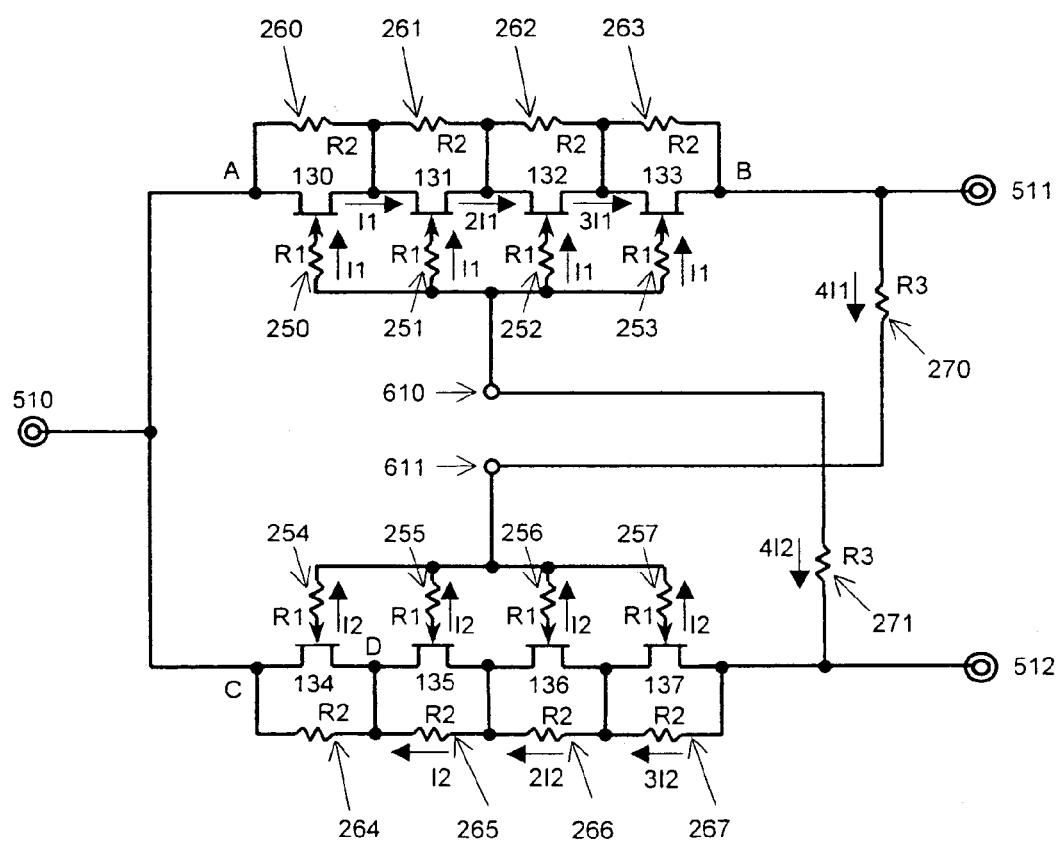
FIG. 15 is a circuit diagram showing an equivalent circuit of the SPDT switching device in accordance with the prior art.

FIG. 3 shows the third harmonic characteristic and isolation characteristic dependent on input power in the SPDT switching device in accordance with Embodiment 2 of the present invention in comparison with those of the SPDT switching device configured in accordance with the prior art. The broken lines indicate the characteristics of the prior art, and the solid lines indicate the characteristics of Embodiment 2. In the characteristic diagram of FIG. 3, the third harmonic characteristic begins to increase when the input power exceeds a certain level. Furthermore, the isolation characteristic begins to decrease when the input power exceeds certain power. FIGS. 6, 11 and 14, described later, are similar to. FIG. 3.

The harmonic characteristic and the isolation characteristic are proportionate to the maximumpower that can be handled. In the configuration of the prior art, both the third harmonic characteristic and the isolation characteristic begin to deteriorate when the input power exceeds 31.5 dBm. However, in Embodiment 2 of the present invention, the characteristics are excellent when the input power is up to 33 dBm. It is thus understood that Embodiment 2 can handle input power 1.5 dBm larger than that of the configuration of the prior art. Furthermore, the current consumption is 32 µA. Hence, the current consumption can be reduced significantly in comparison with 80 µA obtained in the case when a similar circuit is configured on the basis of the prior art.

With this embodiment, the first terminals of the resistor elements 217 to 219, 221 to 223, 225 to 228 and 230 to 233 are connected to the intermediate connection points of the FETs 101 and 116. A voltage, having a phase opposite to that of the voltage applied to the gate terminals of the FETs 101 and 116 to which the first terminals of the resistor elements 217 to 219, 221 to 223, 225 to 228 and 230 to 233 are connected, is applied to the second terminals of the resistor elements 217 to 219, 221 to 223, 225 to 228 and 230 to 233, whereby the potentials at the intermediate connection points of the FETs 101 to 116 can be prevented from lowering. As a result, the power that can be handled can be increased in comparison with that of the prior art. Furthermore, since the potentials at the intermediate connection points of the FETs 101 to 116 can be prevented from lowering, the deterioration of the distortion characteristic and the isolation characteristic owing to the lowering of the potentials at the intermediate connection points of the FETs 101 to 116 is prevented, and excellent high-frequency characteristics are obtained.

It is needless to say that the configuration of the present invention is also similarly applicable to high-frequency switching devices other than SPDT switching devices.

Embodiment 3

Figure 4:
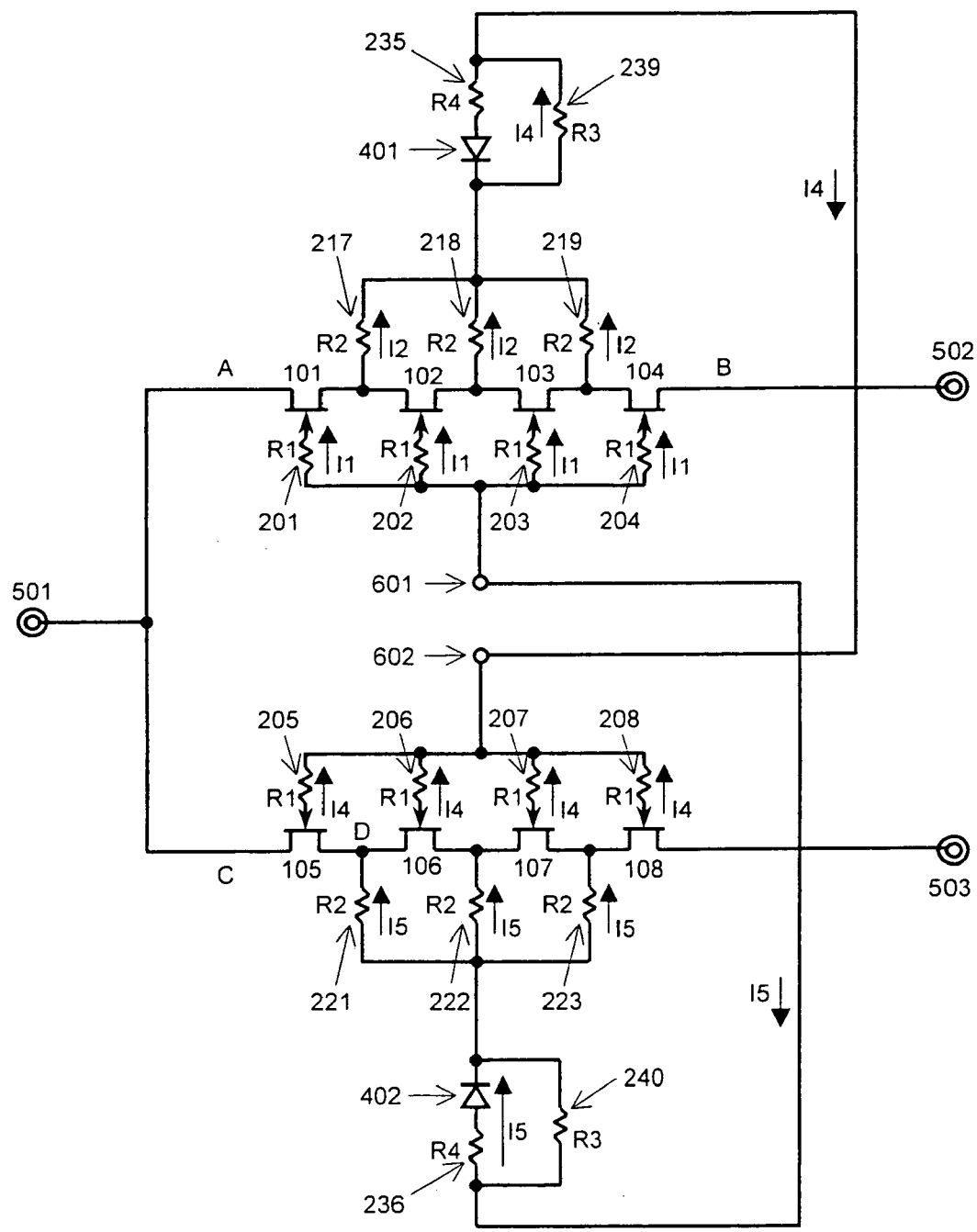
FIG. 4 is a circuit diagram showing an equivalent circuit of an SPDT switching device in accordance with Embodiment 3 of the present invention.

FIG. 4 is a circuit diagram showing the configuration of an SPDT switching device serving as Embodiment 3 of a high-frequency switching device in accordance with the present invention. In FIG. 4, reference codes 101 to 108 respectively designate depletion-type FETs. Reference codes 201 to 208 respectively designate resistor elements having a resistance value R1. Reference codes 217 to 219 respectively designate resistor elements having a resistance value R2. Reference codes 221 to 223 respectively designate resistor elements having a resistance value R2. Reference codes 235 and 236 respectively designate resistor elements having a resistance value R4. Reference codes 239 and 240 respectively designate resistor elements having a resistance value R3. Reference codes 401 and 402 respectively designate diodes. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes I1, I2, I4 and I5 respectively designate currents.

The operation of the switching device configured as shown in the above-mentioned FIG. 4 will be described below.

The basic operation is similar to that of Embodiment 1. Embodiment 3 differs from Embodiment 1 in that the diode 401 is inserted between the control terminal 602 and the resistor elements 217 to 219 connected to the intermediate connection points of the FETs and that the diode 402 is inserted between the control terminal 601 and the resistor elements 221 to 223.

Since the diode 401 is provided, the forward current I2 flowing while the FETs 101 to 104 are in the ON state can be limited. The resistor element 239 is used to control the forward current I2. The resistor element 235 is used to prevent the diode 401 from being broken by ESD (electrostatic discharge) from the control terminal 602. The above descriptions are similarly applicable to the diode 402. The resistor elements 235 and 239 can be omitted.

When it is assumed that 3 V is applied to the control terminal 601 and 0 V is applied to the control terminal 602 in FIG. 4, the forward current I1 flows in the FETs 101 to 104, whereby the FETs 101 to 104 are turned ON. At this time, the potential VB at point B is represented by $$VB=(3-\Phi B)\{1-R1/(3\times R1+4\times R2+12\times R3)\} \quad (6)$$

wherein $\Phi B$ is the built-in voltage of the gate. As clarified by Equation (6), the potential VB at point B is dominantly determined by the resistance values R1 and R3. The potential VB at point B can be raised by increasing the resistance value R3. As described above, reducing the resistance value R1 is undesirable because an insertion loss is increased.

By the setting of R1=R2=50 kΩ and R3=500 kΩ, the current I4 can be reduced to a sufficiently small value of 1 μA or less, whereby the built-in voltage $\Phi B$ is reduced to about 0.2 V at this time. Hence, the potential VB at point B is 2.78 V.

On the other hand, with respect to the OFF path, the potential VD at point D and the current I5 are represented by $$VD=3-\Phi B-R2\times I5I5=(4/3)\times I4 \quad (7)$$

When $\Phi B$=0.2 V, I4=1 μA and R2=50 kΩ are substituted into Equation (7) similarly, VD is 2.73 V.

When the above-mentioned results are substituted into Equation (2) and the calculation is carried out, the maximum power Pmax of the circuit in accordance with Embodiment 3 is 2.90 W. Hence, the circuit configuration of Embodiment 3 can handle power 0.9 W higher than that of the circuit configuration of Embodiment 1.

With this embodiment, an effect similar to that of Embodiment 1 is obtained. In addition, since the diodes 401 and 402 are provided, when the FETs to which the cathodes of the diodes 401 and 402 are connected via the resistor elements are ON, the forward currents of the FETs can be restricted, whereby current consumption can be reduced.

Still further, since the current consumption of the circuit in accordance with Embodiment 3 is about 1 μA, the current consumption can be lowered significantly in comparison with 40 μA of the prior art.

Embodiment 4

Figure 5:
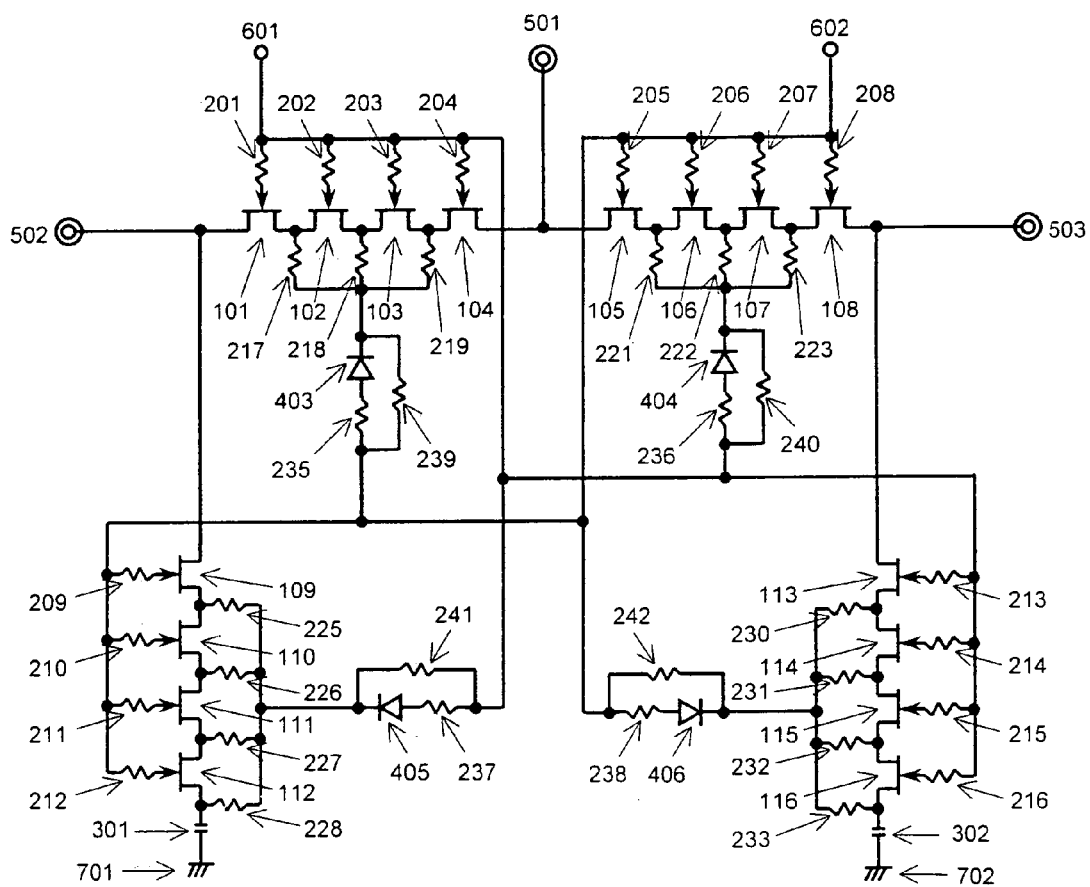
FIG. 5 is a circuit diagram showing an equivalent circuit of an SPDT switching device in accordance with Embodiment 4 of the present invention.

FIG. 5 is a circuit diagram showing the configuration of an SPDT switching device serving as Embodiment 4 of a high-frequency switching device in accordance with the present invention. FIG. 6 is a characteristic-diagram showing the high-frequency characteristics of the SPDT switching device shown in FIG. 5.

In FIG. 5, reference codes 101 to 116 respectively designate depletion-type FETs. Reference codes 201 to 219, 221 to 223, 225 to 228, 230 to 233 and 235 to 242 respectively designate resistor elements. Reference codes 403 to 406 respectively designate diodes. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes 301 and 302 respectively designate capacitors. Reference codes 701 and 702 respectively designate ground terminals.

The operation of the switching device configured as shown in the above-mentioned FIG. 5 will be described below.

The circuit shown in FIG. 5 is an example wherein the circuit of Embodiment 3 shown in FIG. 4 is applied to an SPDT circuit. The basic operation is similar to that of the SPDT circuit of Embodiment 2. Embodiment 4 differs from Embodiment 2 in that a circuit comprising the diode 403 and the resistor elements 235 and 239 is inserted between the control terminal 602 and the resistor elements 217 to 219 connected to the intermediate connection points of the FETs, that a circuit comprising the diode 404 and the resistor elements 236 and 240 is inserted between the control terminal 601 and the resistor elements 221 to 223, that a circuit comprising the diode 405 and the resistor elements 237 and 241 is inserted between the control terminal 601 and the resistor elements 225 to 228, and that a circuit comprising the diode 406 and the resistor elements 238 and 242 is inserted between the control terminal 602 and the resistor elements 230 to 233.

The action and effect obtained by providing the circuit comprising the diode 403 and the resistor elements 235 and 239, the circuit comprising the diode 404 and the resistor elements 236 and 240, the circuit comprising the diode 405 and the resistor elements 237 and 241 and the circuit comprising the diode 406 and the resistor elements 238 and 242 are similar to those of Embodiment 3.

FIG. 6 shows the third harmonic characteristic and isolation characteristic dependent on input power in the SPDT circuit in accordance with Embodiment 4 of the present invention in comparison with those of the SPDT switch circuit configured in accordance with the prior art. The harmonic characteristic and the isolation characteristic are proportionate to the maximum power that can be handled. In the configuration of the prior art, both the third harmonic characteristic and the isolation characteristic begin to deteriorate when the input power exceeds 31.5 dBm. However, in the SPDT circuit in accordance with Embodiment 4 of the present invention, the characteristics are excellent when the input power is up to 34.5 dBm. It is thus understood that Embodiment 4 can handle input power 3.0 dBm larger than that of the configuration of the prior art. Furthermore, the current consumption of the entire circuit is 5 µA or less. Hence, excellent characteristics and low current consumption can be attained at the same time.

With this embodiment, an effect similar to that of Embodiment 1 is obtained. In addition, since the diodes 401 to 404 are provided, when the FETs to which the cathodes of the diodes 401 to 404 are connected via the resistor elements are ON, the forward currents of the FETs can be restricted, whereby current consumption can be reduced.

Still further, since the current consumption of the circuit in accordance with Embodiment 4 is about several µA, the current consumption can be lowered significantly in comparison with 80 µA obtained in the case when a similar circuit is configured on the basis of the prior art.

It is needless to say that the configuration of the present invention is also similarly applicable to high-frequency switching devices other than SPDT switching devices.

Embodiment 5

Figure 7:
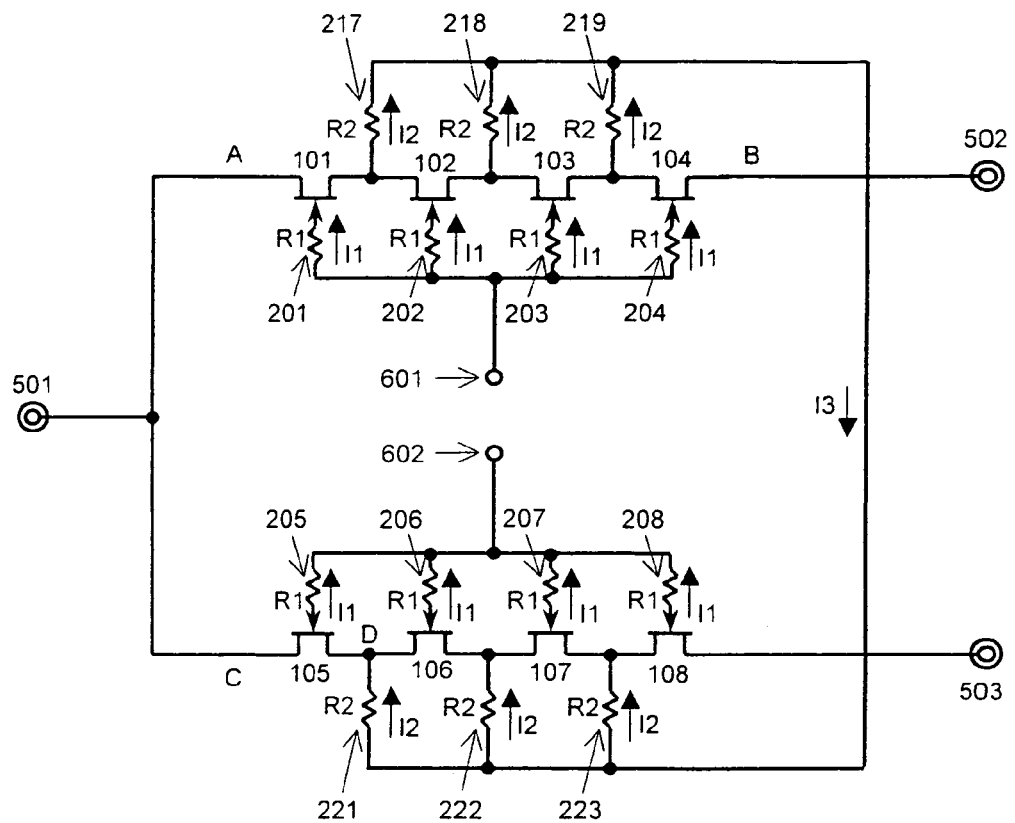
FIG. 7 is a circuit diagram showing an equivalent circuit of an SPDT switching device in accordance with Embodiment 5 of the present invention.

FIG. 7 is a circuit diagram showing the configuration of an SPDT switching device serving as Embodiment 5 of a high-frequency switching device in accordance with the present invention. In FIG. 7, reference codes 101 to 108 respectively designate depletion-type FETs. Reference codes 201 to 208 respectively designate resistor elements having a resistance value R1. Reference codes 217 to 219 and 221 to 223 respectively designate resistor elements having a resistance value R2. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes I1 to I3 respectively designate currents.

The operation of the switching device configured as shown in the above-mentioned FIG. 7 will be described below.

The basic operation is similar to that of Embodiment 1. Embodiment 5 differs from Embodiment 1 in that one ends of the resistor elements 217 to 219, the other ends of which are connected to the intermediate connection points of the FETs 101 to 104, are directly connected to one ends of the resistor elements 221 to 223, the other ends of which are connected to the intermediate connection points of the FETs 105 to 108.

When it is assumed that 3 V is applied to the control terminal 601 and 0 V is applied to the control terminal 602, the potential VB at point B and the potential VD at point D are represented by $$VB = 3 - R1 \times I1 - \Phi B \quad (8)$$

$$VD = VB - 2 \times R2 \times I2 \quad (9)$$

When R1=50 kΩ, I1=1 µA and ΦB=0.2 V are substituted into Equations (8) and (9), the values of VB=2.75 V and VD=2.62 V are obtained. In addition, Pmax=2.61 W is obtained according to Equation (2). Hence, a value about 1.8 times the value of the prior art is obtained.

As described above, with this embodiment, in a first switch circuit section (the FETs 101 to 104) and a second switch circuit section (the FETs 105 to 108), operating reversely with each other, the first terminals of the resistor elements 217 to 219 are connected to the intermediate connection points of the FETs 101 to 104 constituting the first switch circuit section, the first terminals of the resistor elements 221 to 223 are connected to the intermediate connection points of the FETs 105 to 108 constituting the second switch circuit section, and the second terminals of the resistor elements 217 to 219 connected to the first switch circuit section are connected to the second terminals of the resistor elements 221 to 223 connected to the second switch circuit section. With this simple configuration, the potentials at the intermediate connection points of the FETs 101 to 108 can be prevented from lowering. As a result, the power that can be handled can be increased in comparison with that of the prior art.

Still further, since the current consumption of the circuit in accordance with Embodiment 5 is 16 µA, the current consumption can be lowered significantly in comparison with 40 µA of the prior art.

It is needless to say that the configuration of the present invention is also similarly applicable to high-frequency switching devices other than SPDT switching devices.

Embodiment 6

Figure 8:
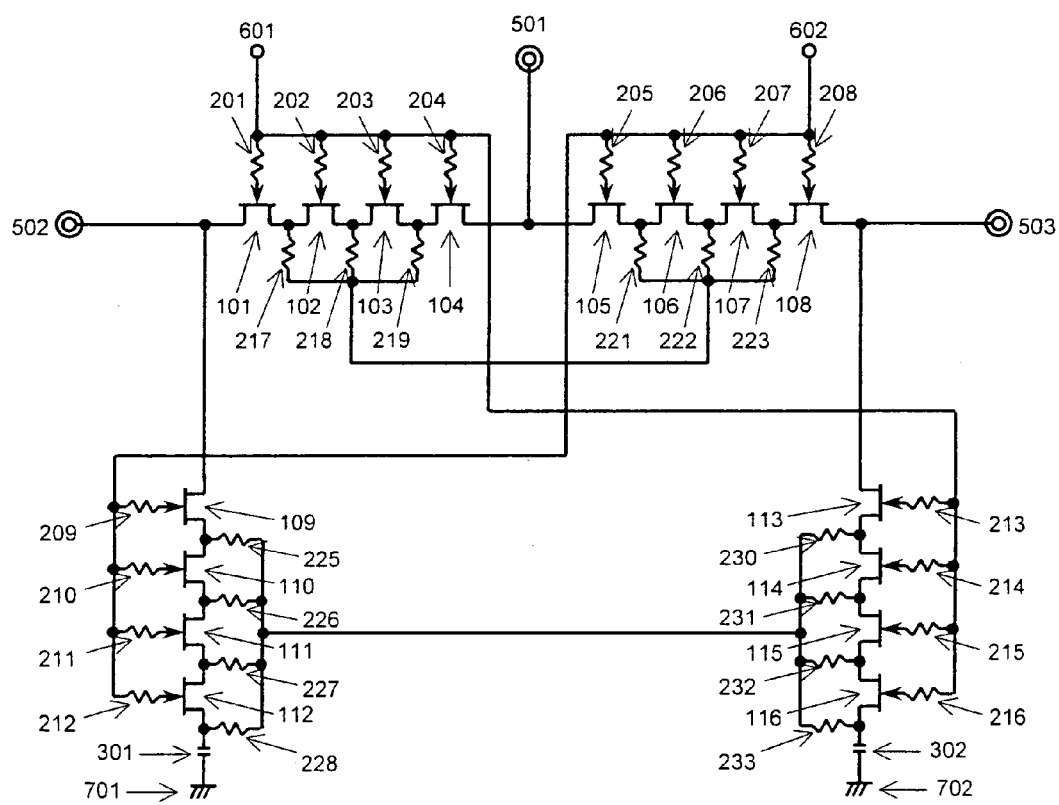
FIG. 8 is a circuit diagram showing an equivalent circuit of an SPDT switching device in accordance with Embodiment 6 of the present invention.

FIG. 8 is a circuit diagram showing the configuration of an SPDT switching device serving as Embodiment 6 of a high-frequency switching device in accordance with the present invention.

In FIG. 8, reference codes 101 to 116 respectively designate depletion-type FETs. Reference codes 201 to 219, 221 to 223, 225 to 228 and 230 to 233 respectively designate resistor elements. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes 301 and 302 respectively designate capacitors. Reference codes 701 and 702 respectively designate ground terminals.

The operation of the switching device configured as shown in the above-mentioned FIG. 8 will be described below.

The circuit shown in FIG. 8 is an example wherein the circuit of Embodiment 5 shown in FIG. 7 is applied to an SPDT circuit. The basic operation is similar to that of the SPDT circuit of Embodiment 2. Embodiment 6 differs from Embodiment 2 in that one ends of the resistor elements 217 to 219, the other ends of which are connected to the intermediate connection points of the FETs 101 to 104, are connected to one ends of the resistor elements 221 to 223, the other ends of which are connected to the intermediate connection points of the FETs 105 to 108, and that one ends of the resistor elements 225 to 228, the other ends of which are connected to the intermediate connection points of the FETs 109 to 112, are connected one ends of the resistor elements 230 to 233, the other ends of which are connected to the intermediate connection points of the FETs 113 to 116.

With the configuration shown in FIG. 8, since currents always flow from the FETs being in the ON state to the FETs being in the OFF state, a stable bias potential is ensured. As a result, high maximum power Pmax and excellent high-frequency characteristics can be obtained.

The FETs 101 to 108 have the same size with a gate width of 4 mm, and the FETs 109 to 116 have the same size with a gate width of 1 mm. By using FETs have the same size or similar sizes as pairs, the current values become constant, whereby stable characteristics can be obtained.

As described above, this embodiment has an action and an effect similar to those of Embodiment 5. Furthermore, since the potentials at the intermediate connection points of the plurality of field-effect transistors can be prevented from lowering, the deterioration of the distortion characteristic and the isolation characteristic owing to the lowering of the potentials at the intermediate connection points of the plurality of field-effect transistors is prevented, and excellent high-frequency characteristics are obtained.

Still further, since the current consumption of the circuit in accordance with Embodiment 6 is 32 µA, the current consumption can be lowered significantly in comparison with 80 µA obtained in the case when a similar circuit is configured on the basis of the prior, art.

It is needless to say that the configuration of the present invention is also similarly applicable to high-frequency switching devices other than SPDT switching devices.

Embodiment 7

Figure 9:
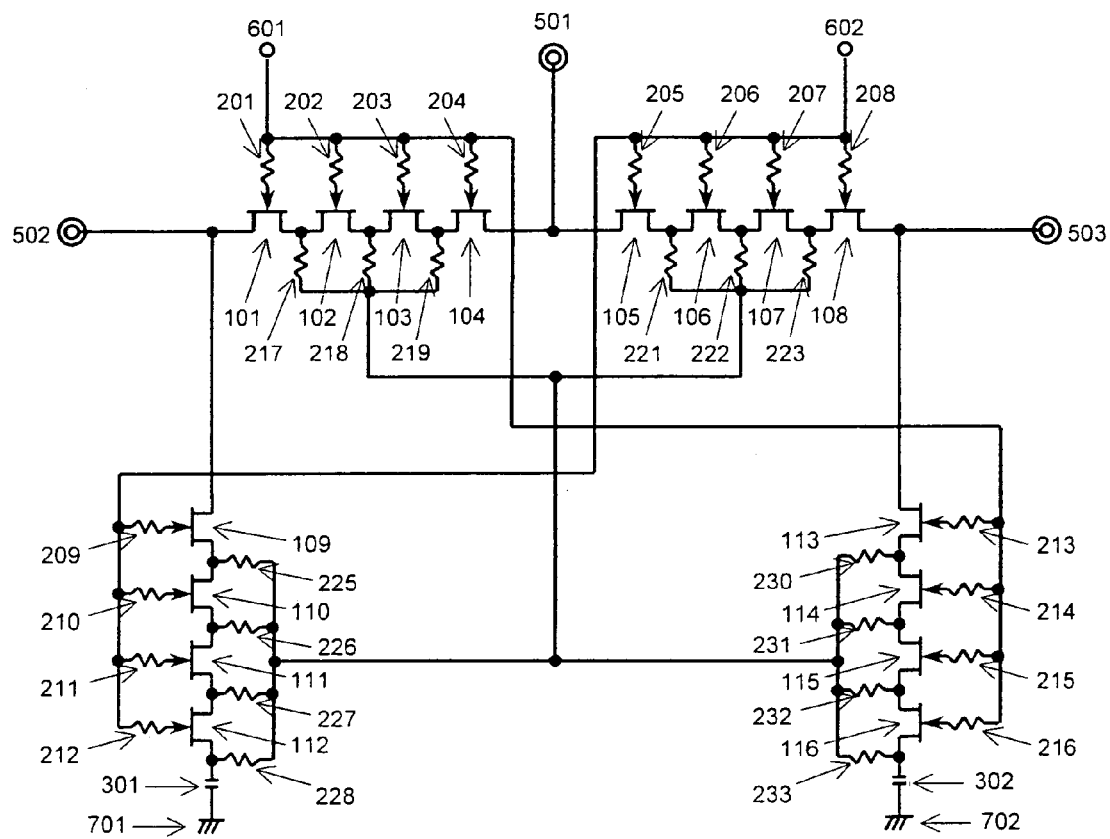
FIG. 9 is a circuit diagram showing an equivalent circuit of an SPDT switching device in accordance with Embodiment 7 of the present invention.

FIG. 9 is a circuit diagram showing the configuration of an SPDT switching device serving as Embodiment 7 of a high-frequency switching device in accordance with the present invention.

In FIG. 9, reference codes 101 to 116 respectively designate depletion-type FETs. Reference codes 201 to 219, 221 to 223, 225 to 228 and 230 to 233 respectively designate resistor elements. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes 301 and 302 respectively designate capacitors. Reference codes 701 and 702 respectively designate ground terminals.

The operation of the switching device configured as shown in the above-mentioned FIG. 9 will be described below.

The basic operation of the circuit shown in FIG. 9 is similar to that of the SPDT circuit of Embodiment 6. Embodiment 7 differs from Embodiment 6 in that the connection point between one ends of the resistor elements 217 to 219, the other ends of which are connected to the intermediate connection points of the FETs 101 to 104 and one ends of the resistor elements 221 to 223, the other ends of which are connected to the intermediate connection points of the FETs 105 to 108 is commonly connected to the connection point between one ends of the resistor elements 225 to 228, the other ends of which are connected to the intermediate connection points of the FETs 109 to 112 and one ends of the resistor elements 230 to 233, the other ends of which are connected to the intermediate connection points of the FETs 113 to 116.

With the configuration shown in FIG. 9, since the currents from the FETs being in the ON state to the FETs being in the OFF state are averaged, a stable bias voltage can be applied even when the circuit is complicated and when FETs always operating reversely do not exist.

As described above, with this Embodiment, the first terminals of the resistor elements 217 to 219, 221 to 223, 225 to 228 and 230 to 233 are connected to the connection points of the FETs 101 to 116 constituting a plurality of switch circuit sections, and the second terminals of the resistor elements 217 to 219, 221 to 223, 225 to 228 and 230 to 233 are connected commonly, whereby the potentials at the intermediate connection points of the FETs 101 to 116 can be prevented from lowering. As a result, the power that can be handled can be increased in comparison with that of the prior art. Furthermore, since the potentials at the intermediate connection points of the FETs 101 to 116 can be prevented from lowering, the deterioration of the distortion characteristic and the isolation characteristic owing to the lowering of the potentials at the intermediate connection points of the FETs 101 to 116 is prevented, and excellent high-frequency characteristics are obtained.

Furthermore, since the currents from the FETs being in the ON state to the FETs being in the OFF state are averaged, a stable bias voltage can be applied even when the circuit is complicated and when FETs always operating reversely do not exist.

Still further, since the current consumption of the circuit in accordance with Embodiment 7 is about several µA, the current consumption can be lowered significantly in comparison with 80 µA obtained in the case when a similar circuit is configured on the basis of the prior art.

It is needless to say that the configuration of the present invention is also similarly applicable to high-frequency switching devices other than SPDT switching devices.

Embodiment 8

Figure 10:
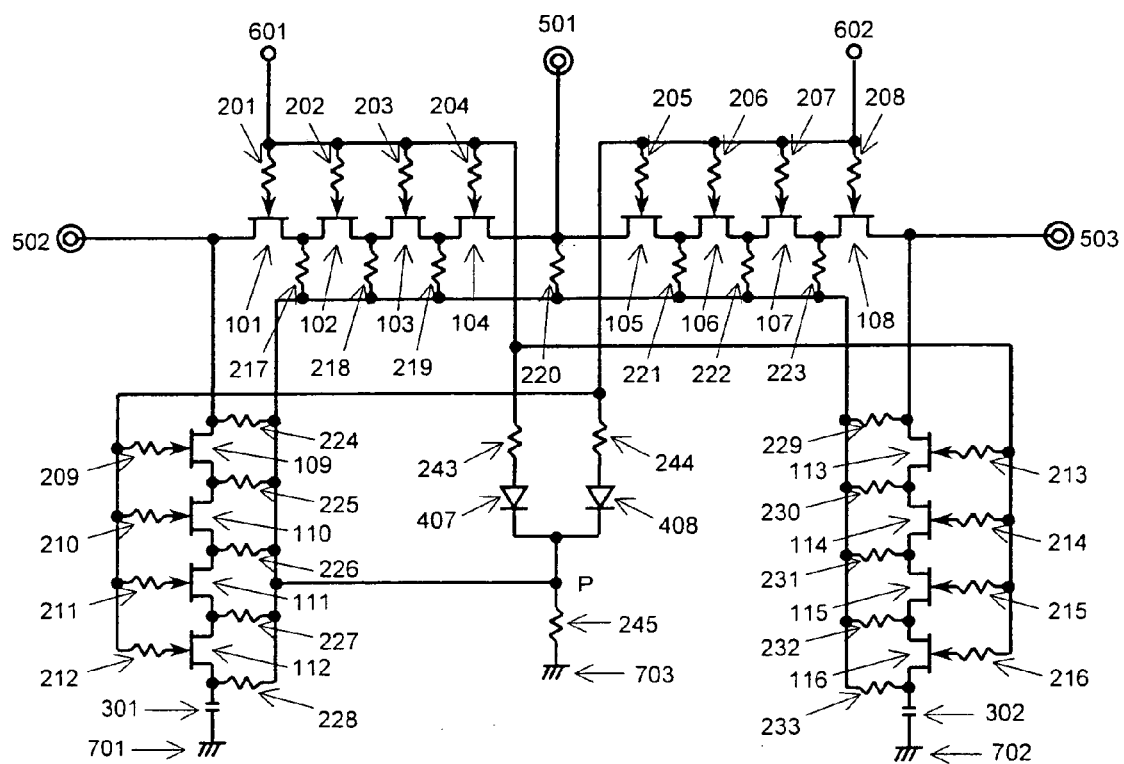
FIG. 10 is a circuit diagram showing an equivalent circuit of an SPDT switching device in accordance with Embodiment 8 of the present invention.

FIG. 10 is a circuit diagram showing the configuration of an SPDT switching device serving as Embodiment 8 of a high-frequency switching device in accordance with the present invention. FIG. 11 is a characteristic diagram showing the high-frequency characteristics of the SPDT switching device shown in FIG. 10.

In FIG. 10, reference codes 101 to 116 respectively designate depletion-type FETs. Reference codes 201 to 233, 243, 244 and 245 respectively designate resistor elements. Reference codes 407 and 408 respectively designate diodes. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes 301 and 302 respectively designate capacitors. Reference codes 701, 702 and 703 respectively designate ground terminals.

The operation of the switching device configured as shown in the above-mentioned FIG. 10 will be described below.

The basic operation of the circuit shown in FIG. 10 is similar to that of the SPDT circuit of Embodiment 6. Embodiment 7 differs from Embodiment 6 in that the anode of the diode 407 is connected to the first control terminal 601 via the resistor element 243, that the anode of the diode 408 is connected to the second control terminal 602 via the resistor element 244, that the cathodes of the diodes 407 and 408 are connected to one end of the resistor element 245, that the other end of the resistor, element 245 is grounded, and that the connection point P of the resistor element 245 and the diodes 407 and 408 is commonly connected to one ends of the resistor elements 217 to 233, the other ends of which are connected to the intermediate connection points of the FETs 101 to 116.

With the configuration shown in FIG. 10, when the level at the control terminal 601 is high, current flows from the control terminal 601 to the ground terminal 703 via the resistor element 243, the diode 407 and the resistor element 245. In addition, when the level at the control terminal 602 is high, current flows from the control terminal 602 to the ground terminal via the resistor element 244, the diode 408 and the resistor element 245. Hence, the potential at point P is held constant. Furthermore, the potential at point P can be set as desired by changing the value of the resistor element 245. The resistor elements 243 and 244 are inserted for protection against ESD. When it is assumed at this time that the resistor elements 243 and 244 have a resistance value of 1 kΩ and that the resistor element 245 has a resistance value of 500 kΩ, the potential at point P can be set at 2.8 V. Hence, the maximum power Pmax that can be handled by the switching device shown in FIG. 10 is 3.10 W, 2.2 times the value of the prior art.

FIG. 11 shows the third harmonic characteristic and isolation characteristic dependent on input power in the SPDT circuit in accordance with Embodiment 8 of the present invention in comparison with those of the SPDT switch circuit of the prior art. The harmonic characteristic and the isolation characteristic are proportionate to the maximum power that can be handled. In the prior art, both the third harmonic characteristic and the isolation characteristic begin to deteriorate when the input power exceeds 31.5 dBm. However, in the SPDT circuit in accordance with Embodiment 8 of the present invention, the characteristics are excellent when the input power is up to 34.5 dBm. It is thus understood that Embodiment 8 can handle input power 3.0 dBm larger than that of the prior art.

With this embodiment, the first terminals of the resistor elements 217 to 219, 221 to 223, 224 to 228 and 229 to 233 are connected to the intermediate connection points of the FETs 101 to 116 constituting the plurality of switch circuit sections, the second terminals of the resistor elements 217 to 219, 221 to 223, 224 to 228 and 229 to 233 are connected commonly, the anode of the first diode 407 is connected to the first control terminal 601, the anode of the second diode 408 is connected to the second control terminal 602, the first terminal of the resistor element 245 is connected to the cathodes of the first and second diodes 407,and 408, the second terminal of the resistor element 245 is grounded, and the connection point P of the first terminal of the resistor element 245 and the first and second diodes 407 and 408 is connected to the second terminals of the resistor elements 217 to 219, 221 to 223, 224 to 228 and 229 to 233, the first terminals of which are connected to the intermediate connection points of the FETs 101 to 116. Hence, the potentials at the intermediate connection points of the FETs 101 to 116 can be prevented from lowering. As a result, the power that can be handled can be increased in comparison with that of the prior art. Furthermore, since the potentials at the intermediate connection points of the FETs 101 to 116 can be prevented from lowering, the deterioration of the distortion characteristic and the isolation characteristic owing to the lowering of the potentials at the intermediate connection points of the FETs 101 to 116 is prevented, and excellent high-frequency characteristics are obtained.

In addition, a constant bias voltage can be applied at all times to the FETs 101 to 116 by using the voltage OR circuit comprising the diodes 407 and 408.

Furthermore, since the current consumption of the circuit in accordance with Embodiment 8 is about 40 µA, the current consumption can be lowered significantly in comparison with 80 µA obtained in the case when a similar circuit is configured on the basis of the prior art.

It is needless to say that the configuration of the present invention is also similarly applicable to high-frequency switching devices other than SPDT switching devices.

Still further, in the configuration shown in FIG. 10, the circuit sections of the shunt FETs 109 to 116 can be omitted.

Embodiment 9

Figure 12:
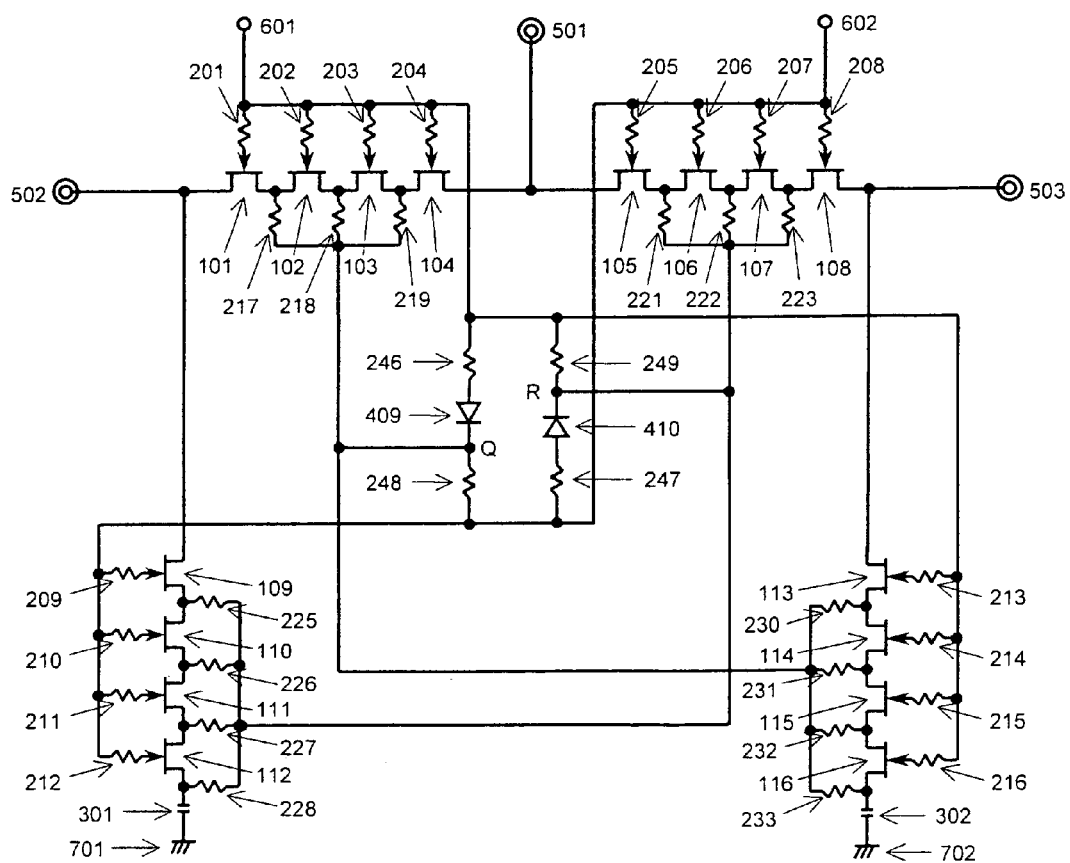
FIG. 12 is a circuit diagram showing an equivalent circuit of an SPDT switching device in accordance with Embodiment 9 of the present invention.

FIG. 12 is a circuit diagram showing the configuration of an SPDT switching device serving as Embodiment 9 of a high-frequency switching device in accordance with the present invention.

In FIG. 12, reference codes 101 to 116 respectively designate depletion-type FETs. Reference codes 201 to 219, 221 to 223, 225 to 228, 230 to 233 and 246 to 249 respectively designate resistor elements. Reference codes 409 and 410 respectively designate diodes. Reference code 501 designates a first high-frequency signal input/output terminal. Reference code 502 designates a second high-frequency signal input/output terminal. Reference code 503 designates a third high-frequency signal input/output terminal. Reference code 601 designates a first control terminal. Reference code 602 designates a second control terminal. Reference codes 301 and 302 respectively designate capacitors. Reference codes 701 and 702 respectively designate ground terminals.

The operation of the switching device configured as shown in the above-mentioned FIG. 12 will be described below.

The basic operation of the circuit shown in FIG. 12 is similar to that of the SPDT circuit of Embodiment 6. Embodiment 9 differs from Embodiment 6 in that the anode of the diode 409 is connected to the first control terminal 601 via the resistor element 246, that one end of the resistor element 248 is connected to the cathode of the diode 409, that the control terminal 602 is connected to the other end of the resistor element 248, that the anode of the diode 410 is connected to the second control terminal 602 via the resistor element 247, that one end of the resistor element 249 is connected to the cathode of the diode 410, that the control terminal 601 is connected to the other end of the resistor element 249, that the cathode of the diode 409 is connected to the resistor elements 217 to 219 and 230 to 233, and that the cathode of the diode 410 is connected to the resistor elements 221 to 223 and 225 to 228.

With the configuration shown in FIG. 12, when the level at the control terminal 601 is high, current flows to the control terminal 602 via the resistor element 246, the diode 409 and the resistor element 248. Furthermore, when the level at the control terminal 602 is high, current flows to the control terminal 601 via the resistor element 247, the diode 410 and the resistor element 249. Hence, the potentials at point Q and point R are fixed. In addition, the potentials at point Q and point R can be set at desired independent values by changing the resistance values of the resistor elements 248 and 249. The resistor elements 246 and 247 are inserted for protection against ESD.

When it is assumed at this time that the resistor elements 246 and 247 have a resistance value of 1 kΩ and that the resistor elements 248 and 249 has a resistance value of 100 kΩ, the potential at point Q can be set at 2.5 V, and the potential at point R can be set at 2.9 V. As a result, the forward bias voltage of the FETs in the ON state can be extended and the reverse bias voltage of the FETs in the OFF state can be extended at the same time. In the above-mentioned conditions, the maximum power Pmax that can be handled by the switching device shown in FIG. 12 is 3.4 W, 2.4 times the value of the prior art. On the other hand, the insertion loss can be reduced by 0.1 dB by extending the forward bias voltage of the FETs in the ON state.

As described above, with this embodiment, the first terminals of the first resistor elements 217 to 219, 221 to 223, 225 to 228 and 230 to 233 are connected to the intermediate connection points of the FETs 101 to 116 respectively constituting the series high-frequency switch circuit sections and the shunt high-frequency switch circuit sections, the anode of the first diode 409 is connected to the first control terminal 601, the cathode of the first diode 409 is connected to the first terminal of the second resistor element 248, the second terminal of the second resistor element 248 is connected to the second control terminal 602, the anode of the second diode 410 is connected to the second control terminal 602, the first terminal of the third resistor element 249 is connected to the cathode of the second diode 410, the second terminal of the third resistor element 249 is connected to the first control terminal 601, and the cathode of the first diode 409 is connected to the second terminals of the first resistor elements 217 to 219 and 230 to 233 connected to the field-effect transistors FETs 101 to 104 and 113 to 116, the gates of which are connected to the first control terminal 601. In addition, the cathode of the second diode 410 is connected to the second-terminals of the first resistor elements 221 to 223 and 225 to 228 connected to the FETs 105 to 108 and 109 to 112, the gates of which are connected to the second control terminal 602. Hence, the potentials at the intermediate connection points of the FETs 101 to 116 can be prevented from lowering. As a result, the power that can be handled can be increased in comparison with that of the prior art. Furthermore, since the potentials at the intermediate connection points of the FETs 101 to 116 can be prevented from lowering, the deterioration of the distortion characteristic and the isolation characteristic owing to the lowering of the potentials at the intermediate connection points of the FETs 101 to 116 is prevented, and excellent high-frequency characteristics are obtained.

Furthermore, by using the combinations of the diodes 409 and 410 and the resistor elements 246 to 249, a low bias voltage can be applied to the FETs being in the ON stage, and a high bias voltage can be applied to the FETs being in the OFF stage.

It is needless to say that the configuration of the present invention is also similarly applicable to high-frequency switching devices other than. SPDT switching devices.

Still further, in the configuration shown in FIG. 12, the circuit sections of the shunt FETs 109 to 116 can be omitted.

Embodiment 10

Figure 13:
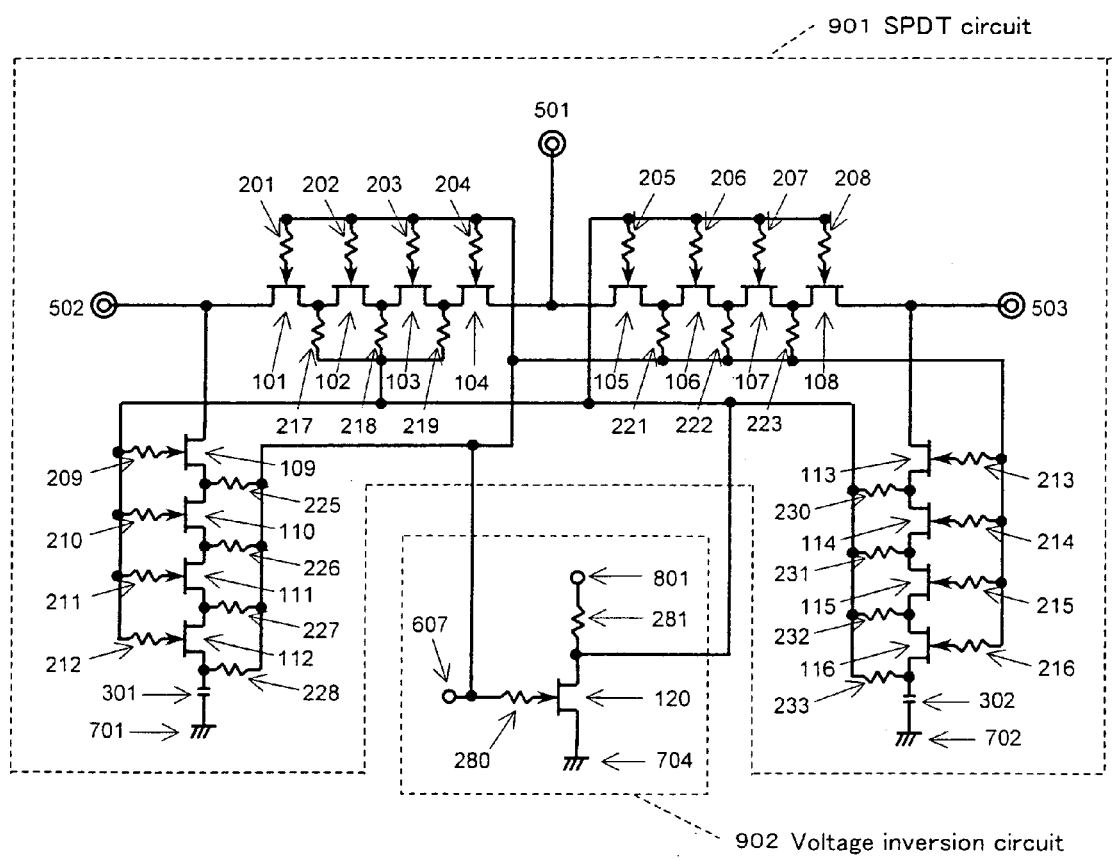
FIG. 13 is a circuit diagram showing an equivalent circuit of an SPDT switching device in accordance with Embodiment 10 of the present invention.

FIG. 13 is a circuit diagram showing the configuration of an SPDT switching device serving as Embodiment 10 of a high-frequency switching device in accordance with the present invention. FIG. 14 is a characteristic diagram showing the high-frequency characteristics of the SPDT switching device shown in FIG. 13.

In FIG. 13, reference codes 101 to 116 respectively designate depletion-type FETs. Reference code 120 designates an enhancement-type FET. Reference codes 201 to 216 respectively designate gate-bias resistor elements having a resistance value of 50 kΩ. Reference codes 217 to 219, 221 to 223, 225 to 228 and 230 to 233 respectively designate resistor elements for fixing FET voltages, having a resistance value of 100 kΩ. Reference code 280 designates the gate resistor element of a voltage-inverting FET, that is, the enhancement-type FET 120, having a resistance value of 100 kΩ. Reference code 281 designates the load resistor element of a voltage inversion circuit, having a resistance value of 100 kΩ. Reference codes 301 and 302 respectively designate capacitors having a capacitance value of 10 pF. Reference code 501 designates a first high-frequency signal input/output terminal. Reference code 502 designates a second high-frequency signal input/output terminal. Reference code 503 designates a third high-frequency signal input/output terminal. Reference code 607 designates a control terminal. Reference codes 701, 702 and 704 respectively designate ground terminals. Reference code 801 designates a power supply terminal. Reference code 901 designates an SPDT circuit. Reference code 902 designates a voltage inversion circuit.

The operations of the SPDT circuit 901 and the voltage inversion circuit 902 configured as shown in the above-mentioned FIG. 13 will be described below.

The basic operation of the SPDT circuit 901 is similar to that of Embodiment 2. Embodiment 10 differs from Embodiment 2 in that the input and output signals of the voltage inversion circuit 902 are simultaneously used as the control signals of the SPDT circuit 901.

In this embodiment, to the control terminal 607, 3 V is applied as a high-level voltage and 0 V is applied as a low-level voltage. The voltage applied to the control terminal 607 is applied to the gate terminal of the enhancement-type FET 120 via the gate resistor element 280 and is output as a reverse-phase signal from the drain terminal. In other words, when the input voltage of the voltage inversion circuit 902 is low, the output voltage is high, and when the input voltage is high, the output voltage is low, whereby the phases are opposite to each other in potential. Hence, the SPDT circuit 901 can be operated by using the input and output voltages of the voltage inversion circuit 902.

FIG. 14 shows the characteristics obtained in the case when the SPDT circuit 901 in accordance with this embodiment is used, in comparison with the characteristics obtained in the case when the SPDT circuit of the prior art is combined with the voltage inversion circuit. Generally, in the voltage inversion circuit 902 comprising an enhancement-type FET, when the output voltage is high (the input voltage is low), the output voltage becomes lower than the power supply voltage owing to a load resistor. Hence, when the SPDT circuit in accordance with the prior art is operated so as to be controlled by a single control voltage from the single control terminal 607 by using the voltage inversion circuit, sufficient voltage is not obtained in many cases. However, even when a single control voltage is used, excellent high-frequency characteristics can be obtained by using the configuration of the present invention.

It is needless to say that the configuration of the present invention is also similarly applicable to high-frequency switching devices other than SPDT switching devices.

Furthermore, the voltage inversion circuit 902 can also be applied to the SPDT switching devices shown in FIGS. 1, 4, 5, 7, 8, 9, 10 and 12 in a way similar to that shown in FIG. 13.

Still further, a semiconductor device in accordance with the present invention is obtained by integrating the SPDT switching device in accordance with each of the above-mentioned embodiments on a semiconductor substrate.

The invention claimed is:

1. A high-frequency switching device comprising:
a plurality of high-frequency signal input/output terminals through which high-frequency signals are input/output, and a plurality of high-frequency switch circuit sections disposed between said plurality of high-frequency signal input/output terminals, wherein
each of said plurality of high-frequency switch circuit sections comprises a series connection circuit of a plurality of field-effect transistors, either a high-level voltage or a low-level voltage is applied to the gate terminals of said plurality of field-effect transistors, whereby ON and OFF states are attained, furthermore, in said plurality of high-frequency switch circuit sections, that is, first and second high-frequency switch circuit sections operating reversely with each other, the first terminals of first resistor elements are connected to the intermediate connection points of the first plurality of field-effect transistors constituting said first high-frequency switch circuit section, the first terminals of second resistor elements are connected to the intermediate connection points of the second plurality of field-effect transistors constituting said second high-frequency switch circuit section, and the second terminals of said first resistor elements connected to said first high-frequency switch circuit section are connected to the second terminals of said second resistor elements connected to said second high-frequency switch circuit section.

2. A high-frequency switching device set forth in claim 1, comprising a voltage inversion circuit and first and second control terminals to which the input/output signals of said voltage inversion circuit are applied, wherein either a high-level voltage or a low-level voltage is applied to the gate terminals of said plurality of field-effect transistors from either said first or second control terminal.

3. A high-frequency switching device comprising:
a plurality of high-frequency signal input/output terminals through which high-frequency signals are input/output, a plurality of series high-frequency switch circuit sections disposed between said plurality of high-frequency signal input/output terminals, and a plurality of shunt high-frequency switch circuit sections disposed between said plurality of high-frequency signal input/output terminals and ground terminals, wherein
each of said plurality of series high-frequency switch circuit sections and each of said plurality of shunt high-frequency switch circuit sections respectively comprise a series connection circuit of a plurality of field-effect transistors, either a high-level voltage or a low-level voltage is applied to the gate terminals of said plurality of field-effect transistors, whereby ON and OFF states are attained, furthermore, in each of a plurality of series high-frequency switch circuit sections and each of a plurality of shunt high-frequency switch circuit sections, that is, first and second high-frequency switch circuit sections operating reversely with each other, the first terminals of first resistor elements are connected to the intermediate connection points of the first plurality of field-effect transistors constituting said first high-frequency switch circuit section, the first terminals of second resistor elements are connected to the intermediate connection points of the second plurality of field-effect transistors constituting said second high-frequency switch circuit section, and the second terminals of the first resistor elements connected to said first high-frequency switch circuit section are connected to the second terminals of said second resistor elements connected to said second high-frequency switch circuit section.

4. A high-frequency switching device set forth in claim 3, comprising a voltage inversion circuit and first and second control terminals to which the input/output signals of said voltage inversion circuit are applied, wherein either a high-level voltage or a low-level voltage is applied to the gate terminals of said plurality of field-effect transistors from either said first or second control terminal.

5. A high-frequency switching device comprising:
a plurality of high-frequency signal input/output terminals through which high-frequency signals are input/output, and a plurality of high-frequency switch circuit sections disposed between said plurality of high-frequency signal input/output terminals, wherein
each of said plurality of high-frequency switch circuit sections comprises a series connection circuit of a plurality of field-effect transistors, either a high-level voltage or a low-level voltage is applied to the gate terminals of said plurality of field-effect transistors, whereby ON and OFF states are attained, furthermore, the first terminals of resistor elements are connected to the intermediate connection points of the plurality of field-effect transistors respectively constituting said plurality of high-frequency switch circuit sections, and the second terminals of said resistor elements are all connected commonly.

6. A high-frequency switching device set forth in claim 5, comprising a voltage inversion circuit and first and second control terminals to which the input/output signals of said voltage inversion circuit are applied, wherein either a high-level voltage or a low-level voltage is applied to the gate terminals of said plurality of field-effect transistors from either said first or second control terminal.

7. A high-frequency switching device comprising:
a plurality of high-frequency signal input/output terminals through which high-frequency signals are input/output, a plurality of series high-frequency switch circuit sections disposed between said plurality of high-frequency signal input/output terminals, and a plurality of shunt high-frequency switch circuit sections disposed between said plurality of high-frequency signal input/output terminals and ground terminals, wherein each of said plurality of series high-frequency switch circuit sections and each of said plurality of shunt high-frequency switch circuit sections respectively comprise a series connection circuit of a plurality of field-effect transistors, either a high-level voltage or a low-level voltage is applied to the gate terminals of said plurality of field-effect transistors, whereby ON and OFF states are attained, furthermore, the first terminals of resistor elements are connected to the intermediate connection points of the plurality of field-effect transistors respectively constituting said plurality of series high-frequency switch circuit sections and said plurality of shunt high-frequency switch circuit sections, and the second terminals of said resistor elements are all connected commonly.

8. A high-frequency switching device set forth in claim 7, comprising a voltage inversion circuit and first and second control terminals to which the input/output signals of said voltage inversion circuit are applied, wherein either a high-level voltage or a low-level voltage is applied to the gate terminals of said plurality of field-effect transistors from either said first or second control terminal.

9. A semiconductor device obtained by integrating, on a semiconductor substrate, a high-frequency switching device comprising a plurality of high-frequency signal input/output terminals through which high-frequency signals are input/output, and a plurality of high-frequency switch circuit sections disposed between said plurality of high-frequency signal input/output terminals, wherein each of said plurality of high-frequency switch circuit sections comprises a series connection circuit of a plurality of field-effect transistors, either a high-level voltage or a low-level voltage is applied to the gate terminals of said plurality of field-effect transistors, whereby ON and OFF states are attained, furthermore, in said plurality of high-frequency switch circuit sections, that is, first and second high-frequency switch circuit sections operating reversely with each other, the first terminals of first resistor elements are connected to the intermediate connection points of the first plurality of field-effect transistors constituting said first high-frequency switch circuit section, the first terminals of second resistor elements are connected to the intermediate connection points of the second plurality of field-effect transistors constituting said second high-frequency switch circuit section, and the second terminals of said first resistor elements connected to said first high-frequency switch circuit section are connected to the second terminals of said second resistor elements connected to said second high-frequency switch circuit section.

10. A semiconductor device obtained by integrating, on a semiconductor substrate, a high-frequency switching device comprising a plurality of high-frequency signal input/output terminals through which high-frequency signals are input/output, a plurality of series high-frequency switch circuit sections disposed between said plurality of high-frequency signal input/output terminals, and a plurality of shunt high-frequency switch circuit sections disposed between said plurality of high-frequency signal input/output terminals and ground terminals, wherein each of said plurality of series high-frequency switch circuit sections and each of said plurality of shunt high-frequency switch circuit sections respectively comprise a series connection circuit of a plurality of field-effect transistors, either a high-level voltage or a low-level voltage is applied to the gate terminals of said plurality of field-effect transistors, whereby ON and OFF states are attained, furthermore, in each of a plurality of series high-frequency switch circuit sections and each of a plurality of shunt high-frequency switch circuit sections, that is, first and second high-frequency switch circuit sections operating reversely with each other, the first terminals of first resistor elements are connected to the intermediate connection points of the first plurality of field-effect transistors constituting said first high-frequency switch circuit section, the first terminals of second resistor elements are connected to the intermediate connection points of the second plurality of field-effect transistors constituting said second high-frequency switch circuit section, and the second terminals of the first resistor elements connected to said first high-frequency switch circuit section are connected to the second terminals of said second resistor elements connected to said second high-frequency switch circuit section.

11. A semiconductor device obtained by integrating, on a semiconductor substrate, a high-frequency switching device comprising a plurality of high-frequency signal input/output terminals through which high-frequency signals are input/output, and a plurality of high-frequency switch circuit sections disposed between said plurality of high-frequency signal input/output terminals, wherein each of said plurality of high-frequency switch circuit sections comprises a series connection circuit of a plurality of field-effect transistors, either a high-level voltage or a low-level voltage is applied to the gate terminals of said plurality of field-effect transistors, whereby ON and OFF states are attained, furthermore, the first terminals of resistor elements are connected to the intermediate connection points of the plurality of field-effect transistors respectively constituting said plurality of high-frequency switch circuit sections, and the second terminals of said resistor elements are all connected commonly.

12. A semiconductor device obtained by integrating, on a semiconductor substrate, a high-frequency switching device comprising a plurality of high-frequency signal input/output terminals through which high-frequency signals are input/output, a plurality of series high-frequency switch circuit sections disposed between said plurality of high-frequency signal input/output terminals, and a plurality of shunt high-frequency switch circuit sections disposed between said plurality of high-frequency signal input/output terminals and ground terminals, wherein each of said plurality of series high-frequency switch circuit sections and each of said plurality of shunt high-frequency switch circuit sections respectively comprise a series connection circuit of a plurality of field-effect transistors, either a high-level voltage or a low-level voltage is applied to the gate terminals of said plurality of field-effect transistors, whereby ON and OFF states are attained, furthermore, the first terminals of resistor elements are connected to the intermediate connection points of the plurality of field-effect transistors respectively constituting said plurality of series high-frequency switch circuit sections and said plurality of shunt high-frequency switch circuit sections, and the second terminals of said resistor elements are all connected commonly.

* * * * *